(12) United States Patent
Sawachi et al.

(10) Patent No.: US 12,347,660 B2
(45) Date of Patent: *Jul. 1, 2025

(54) SUBSTRATE PROCESSING APPARATUS, SUBSTRATE PROCESSING SYSTEM, AND MAINTENANCE METHOD

(71) Applicant: Tokyo Electron Limited, Tokyo (JP)

(72) Inventors: Atsushi Sawachi, Miyagi (JP); Jun Hirose, Miyagi (JP); Takuya Nishijima, Miyagi (JP); Ichiro Sone, Miyagi (JP); Suguru Sato, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/746,251

(22) Filed: Jun. 18, 2024

(65) Prior Publication Data
US 2024/0339306 A1     Oct. 10, 2024

Related U.S. Application Data

(63) Continuation of application No. 17/504,578, filed on Oct. 19, 2021, now Pat. No. 12,040,166.

(30) Foreign Application Priority Data

Oct. 19, 2020    (JP) ................................ 2020-175383

(51) Int. Cl.
*H01J 37/32*        (2006.01)
(52) U.S. Cl.
CPC .... *H01J 37/32733* (2013.01); *H01J 37/3244* (2013.01); *H01J 37/32899* (2013.01)

(58) Field of Classification Search
CPC ............ H01J 37/32733; H01J 37/3244; H01J 37/32899
USPC ......................................................... 156/719
See application file for complete search history.

(56) References Cited

U.S. PATENT DOCUMENTS 12,040,166 B2 *   7/2024   Sawachi ........... H01L 21/67724
2015/0170943 A1    6/2015   Nguyen et al.

FOREIGN PATENT DOCUMENTS

JP        2019-197849 A    11/2019

* cited by examiner

*Primary Examiner* — James D Sells
(74) *Attorney, Agent, or Firm* — XSENSUS LLP

(57) ABSTRACT

A substrate processing apparatus is provided. The substrate processing apparatus comprise: a first chamber including a sidewall providing an opening, the first chamber further including a movable part movable upward and downward within the first chamber; a substrate support disposed within the first chamber; a second chamber disposed within the first chamber and defining, together with the substrate support, a processing space in which a substrate mounted on the substrate support is processed, the second chamber being separable from the first chamber and transportable between an inner space of the first chamber and the outside of the first chamber via the opening; a clamp releasably fixing the second chamber to the movable part extending above the second chamber; a release mechanism configured to release the fixing of the second chamber by the clamp; and a lift mechanism configured to move the movable part upward and downward.

20 Claims, 20 Drawing Sheets

SUBSTRATE PROCESSING APPARATUS, SUBSTRATE PROCESSING SYSTEM, AND MAINTENANCE METHOD

CROSS-REFERENCE TO RELATED APPLICATIONS

This application is a continuation of U.S. application Ser. No. 17/504,578, filed on Oct. 19, 2021, which claims priority to and the benefit of Japanese Patent Application No. 2020-175383, filed on Oct. 19, 2020, the disclosure of each are incorporated herein by reference in its entirety.

TECHNICAL FIELD

An exemplary embodiment of the present disclosure relates to a substrate processing apparatus, a substrate processing system, and a maintenance method.

BACKGROUND

A plasma processing apparatus is used in plasma processing for a substrate. The plasma processing apparatus includes a chamber and a substrate support. The substrate support supports a substrate within the chamber. The substrate is processed by a chemical species from plasma generated from a processing gas within the chamber. Japanese Patent Application Publication No. 2019-197849 discloses such a plasma processing apparatus.

SUMMARY

The present disclosure provides a technology that enables easy maintainability of a chamber defining a processing space in which a substrate is processed.

To this end, a substrate processing apparatus is provided, comprising: a first chamber including a sidewall providing an opening, the first chamber further including a movable part movable upward and downward within the first chamber; a substrate support disposed within the first chamber; a second chamber disposed within the first chamber and defining, together with the substrate support, a processing space in which a substrate mounted on the substrate support is processed, the second chamber being separable from the first chamber and transportable between an inner space of the first chamber and the outside of the first chamber via the opening; a clamp releasably fixing the second chamber to the movable part extending above the second chamber; a release mechanism configured to release the fixing of the second chamber by the clamp; and a lift mechanism configured to move the movable part upward and downward.

DETAILED DESCRIPTION

Figure 1:
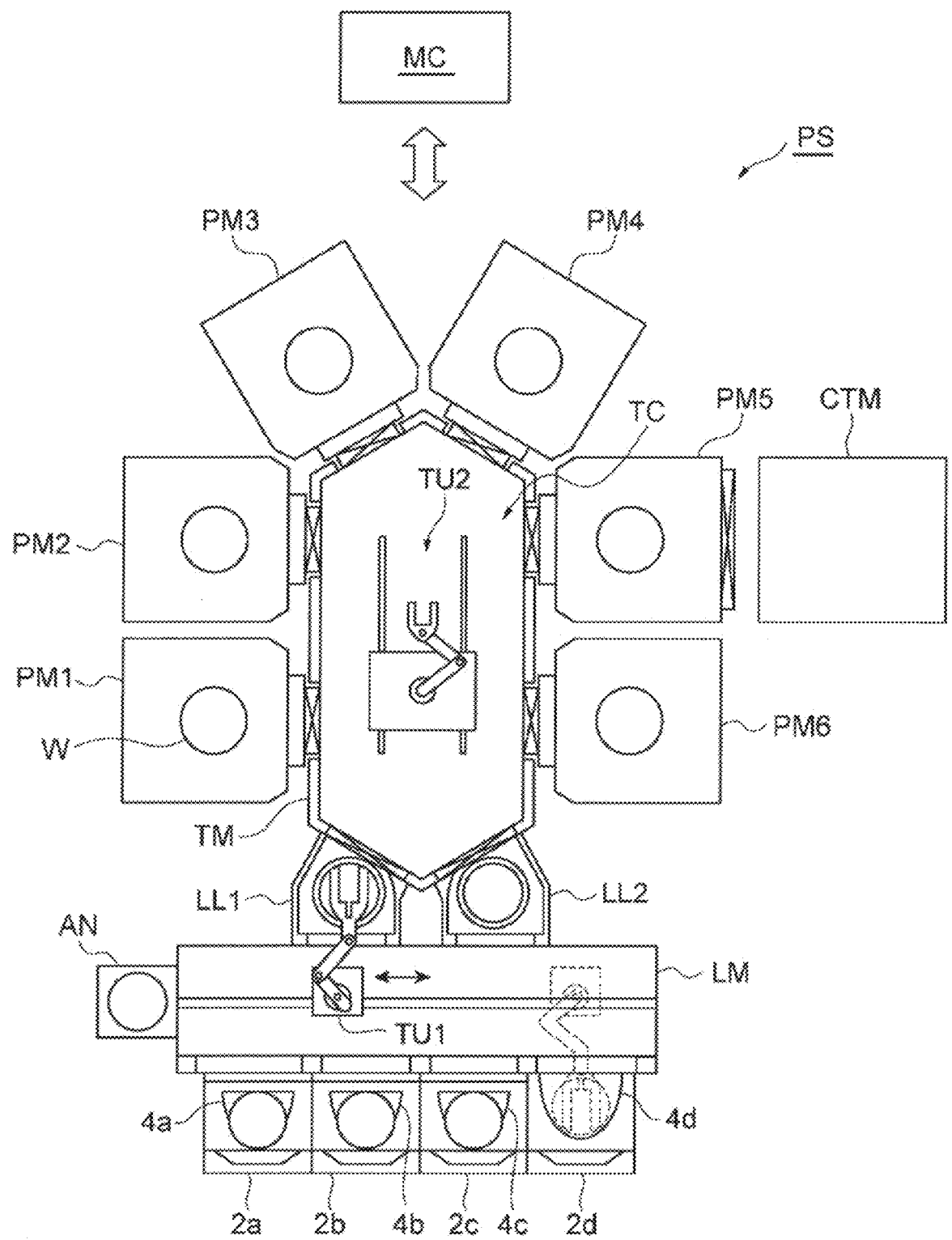
FIG. 1 is a diagram illustrating a substrate processing system according to an exemplary embodiment.

Hereinafter, various exemplary embodiments will be described.

In an exemplary embodiment, a substrate processing apparatus is provided. The substrate processing apparatus includes a first chamber, a substrate support, a second chamber, a clamp, a release mechanism, and a lift mechanism. The first chamber includes a sidewall providing an opening and further includes a movable part movable upward and downward within the first chamber. The substrate support is disposed within the first chamber. The second chamber is disposed within the first chamber and defines, together with the substrate support, a processing space in which a substrate mounted on the substrate support is processed. The second chamber is separable from the first chamber and transportable between an inner space of the first chamber and the outside of the first chamber via the opening of the sidewall of the first chamber. The clamp releasably fixes the second chamber to the movable part extending above the second chamber. The release mechanism is configured to release the fixing of the second chamber by the clamp. The lift mechanism is configured to move the movable part upward and downward.

In the substrate processing apparatus of the embodiment, the substrate is processed within the second chamber. The second chamber is disposed within the first chamber and is fixed to the first chamber. It is possible to release the fixing of the second chamber to the first chamber using the release mechanism. In addition, in a state in which the fixing of the second chamber to the first chamber is released, it is possible to carry out the second chamber to the outside of the first chamber from the opening provided in the sidewall of the first chamber. Therefore, according to the embodiment, it is possible to easily maintain a chamber defining the processing space in which the substrate is processed, that is, the second chamber.

In an exemplary embodiment, the second chamber may include a ceiling portion extending above the processing space. The clamp may releasably fix the ceiling portion to the movable part of the first chamber.

In an exemplary embodiment, the clamp may include a support and a spring. The support has a lower end configured to suspend the ceiling portion of the second chamber therefrom. The spring urges the ceiling portion of the second chamber to the movable part of the first chamber via the lower end of the support.

In an exemplary embodiment, the release mechanism may include an air supply device that applies air pressure to separate the lower end of the support from the second chamber in order to release the fixing of the ceiling portion by the clamp.

In an exemplary embodiment, the substrate processing apparatus may further include a conductor part and a contact. The conductor part is provided along an outer periphery of the substrate support and connected to the ground. The contact is electrically connected to the conductor part. The second chamber may be in contact with the contact while defining the processing space together with the substrate support. The contact may extend upward from the conductor part.

In an exemplary embodiment, the contact may be configured to be in elastic contact with the second chamber. The contact may include a spring.

In an exemplary embodiment, the contact may be a pin. The second chamber may provide a recess into which the pin is fitted. The pin may have a tapered shape. The recess of the second chamber may have a tapered shape corresponding to the tapered shape of the pin.

In an exemplary embodiment, the contact may be flexible and may include a film formed of a conductive material. The substrate processing apparatus may further include a separate air supply device configured to apply air pressure to the film to pressurize the film into the second chamber.

In an exemplary embodiment, the second chamber may include a bottom portion extending below the processing space, and the bottom portion may be in contact with the contact in the second chamber.

In an exemplary embodiment, the substrate processing apparatus may further include a cover ring having an inner edge portion and an outer edge portion. An edge ring is disposed on the substrate support. The inner edge portion of the cover ring may support the outer edge portion of the edge ring disposed thereon. The outer edge portion of the cover ring may include a plurality of convex portions protruding in a radial direction. The second chamber may include a bottom portion having an inner edge portion defining an inner hole through which the edge ring and the cover ring may pass. The second chamber may support the cover ring in a state in which the plurality of convex portions are disposed on the inner edge portion of the bottom portion. The inner hole may include a plurality of notches through which a plurality of convex portions can pass and which are provided by the inner edge portion.

In an exemplary embodiment, the substrate processing apparatus may be a plasma processing apparatus.

In a separate exemplary embodiment, a substrate processing system is provided. The substrate processing system includes a substrate processing apparatus according to any one of the various exemplary embodiments described above, a transfer module, and a control unit. The transfer module has a separate chamber and a transfer device. The separate chamber of the transfer module includes a sidewall providing an opening. The transfer device is configured to transfer the second chamber from an inner space of the first chamber to an inner space of the separate chamber via the opening of the first chamber and the opening of the separate chamber. The control unit is configured to control the lift mechanism, the release mechanism, and the transfer device. The control unit controls the lift mechanism to separate the movable part of the first chamber and the second chamber upward from the substrate support. The control unit controls the release mechanism to release the fixing of the second chamber by the clamp to transfer and receive the second chamber to and from the transfer device. The control unit controls the transfer device to transfer the second chamber from the inner space of the first chamber to the inner space of the separate chamber via the opening of the first chamber and the opening of the separate chamber.

In an exemplary embodiment, the substrate processing apparatus may further include a gate valve configured to open and close the opening of the first chamber. The transfer module may further include a gate valve configured to open and close the opening of the separate chamber, and may be configured to be movable. In a state in which the separate chamber is connected to the first chamber, the sidewall of the first chamber, the sidewall of the separate chamber, the gate valve of the substrate processing apparatus, and the gate valve of the transfer module may define a sealed space thereamong. The substrate processing apparatus may further include an exhaust device configured to depressurize the sealed space.

In another exemplary embodiment, a maintenance method is provided. The maintenance method includes a process (a) of separating a second chamber upward from a substrate support within a first chamber of a substrate processing apparatus. The substrate processing apparatus includes the first chamber, the substrate support, and the second chamber. The first chamber includes a sidewall providing an opening and further includes a movable part extending above the second chamber and movable upward and downward within the first chamber. The substrate support is disposed within the first chamber. The second chamber is disposed within the first chamber and defines, together with the substrate support, a processing space in which a substrate mounted on the substrate support is processed. The maintenance method further includes a process (b) of releasing the fixing of the second chamber to the movable part of the first chamber. The maintenance method further includes a process (c) of transferring the second chamber from an inner space of the first chamber to an inner space of a chamber of a transfer module via the opening.

Hereinafter, various exemplary embodiments will be described in detail with reference to the drawings. In addition, in each drawing, the same reference numerals will be given to the same or corresponding parts throughout the drawings.

FIG. 1 is a diagram illustrating a substrate processing system according to an exemplary embodiment. A substrate processing system PS shown in FIG. 1 is provided with process modules PM1 to PM6, a transfer module CTM, and a control unit MC.

The substrate processing system PS may further include bases 2a to 2d, containers 4a to 4d, an aligner AN, load-lock modules LL1 and LL2, and a transfer module TM. In addition, the number of bases, the number of containers, and the number of load-lock modules in the substrate processing system PS may be any number equal to or greater than one. In addition, the number of process modules in the substrate processing system PS may be any number equal to or greater than one.

The bases 2a to 2d are arranged along one edge of a loader module LM. The containers 4a to 4d are mounted on the bases 2a to 2d, respectively. Each of the containers 4a to 4d is, for example, a container called a front opening unified pod (FOUP). Each of the containers 4a to 4d is configured to accommodate a substrate W therein.

The loader module LM has a chamber. The pressure in the chamber of the loader module LM is set to atmospheric pressure. The loader module LM has a transfer device TU1. The transfer device TU1 is, for example, a transfer robot and is controlled by the control unit MC. The transfer device TU1 is configured to transfer the substrate W via the chamber of the loader module LM. The transfer device TU1 may transfer the substrate W between each of the containers 4a to 4d and the aligner AN, between the aligner AN and each of the load-lock modules LL1 and LL2, and between each of the load-lock modules LL1 and LL2 and each of the containers 4a to 4d. The aligner AN is connected to the loader module LM. The aligner AN is configured to adjust a position (correct a position) of the substrate W.

Each of the load-lock module LL1 and the load-lock module LL2 is provided between the loader module LM and the transfer module TM. Each of the load-lock module LL1 and the load-lock module LL2 provides a preliminary decompression chamber. Each of the load-lock module LL1 and the load-lock module LL2 is connected to the loader module LM via a gate valve. In addition, each of the load-lock module LL1 and the load-lock module LL2 is connected to the transfer module TM via a gate valve.

The transfer module TM has a transfer chamber TC which can be depressurized. The transfer module TM has a transfer device TU2. The transfer device TU2 is, for example, a transfer robot and is controlled by the control unit MC. The transfer device TU2 is configured to transfer the substrate W via the transfer chamber TC. The transfer device TU2 may transfer the substrate W between each of the load-lock modules LL1 and LL2 and each of the process modules PM1 to PM6, and between any two process modules of the process modules PM1 to PM6.

Each of the process modules PM1 to PM6 is connected to the transfer module TM via a gate valve. Each of the process modules PM1 to PM6 is an apparatus configured to perform dedicated substrate processing. At least one of the process modules PM1 to PM6 is a substrate processing apparatus according to an exemplary embodiment described later.

The transfer module CTM has a chamber and a transfer device. The transfer module CTM is controlled by the control unit MC. The transfer module CTM has the transfer device. The transfer device of the transfer module CTM is configured to transfer the second chamber provided within the first chamber of the substrate processing apparatus into the chamber of the transfer module CTM. Details of the transfer module CTM will be described later.

The control unit MC is configured to control each part of the substrate processing system PS. The control unit MC may be a computer including a processor, a storage device, an input device, a display device, and the like. The control unit MC executes a control program stored in the storage device and controls each part of the substrate processing system PS based on recipe data stored in the storage device. A maintenance method according to an exemplary embodiment described later may be performed in the substrate processing system PS by controlling each part of the substrate processing system PS by the control unit MC.

Figure 2:
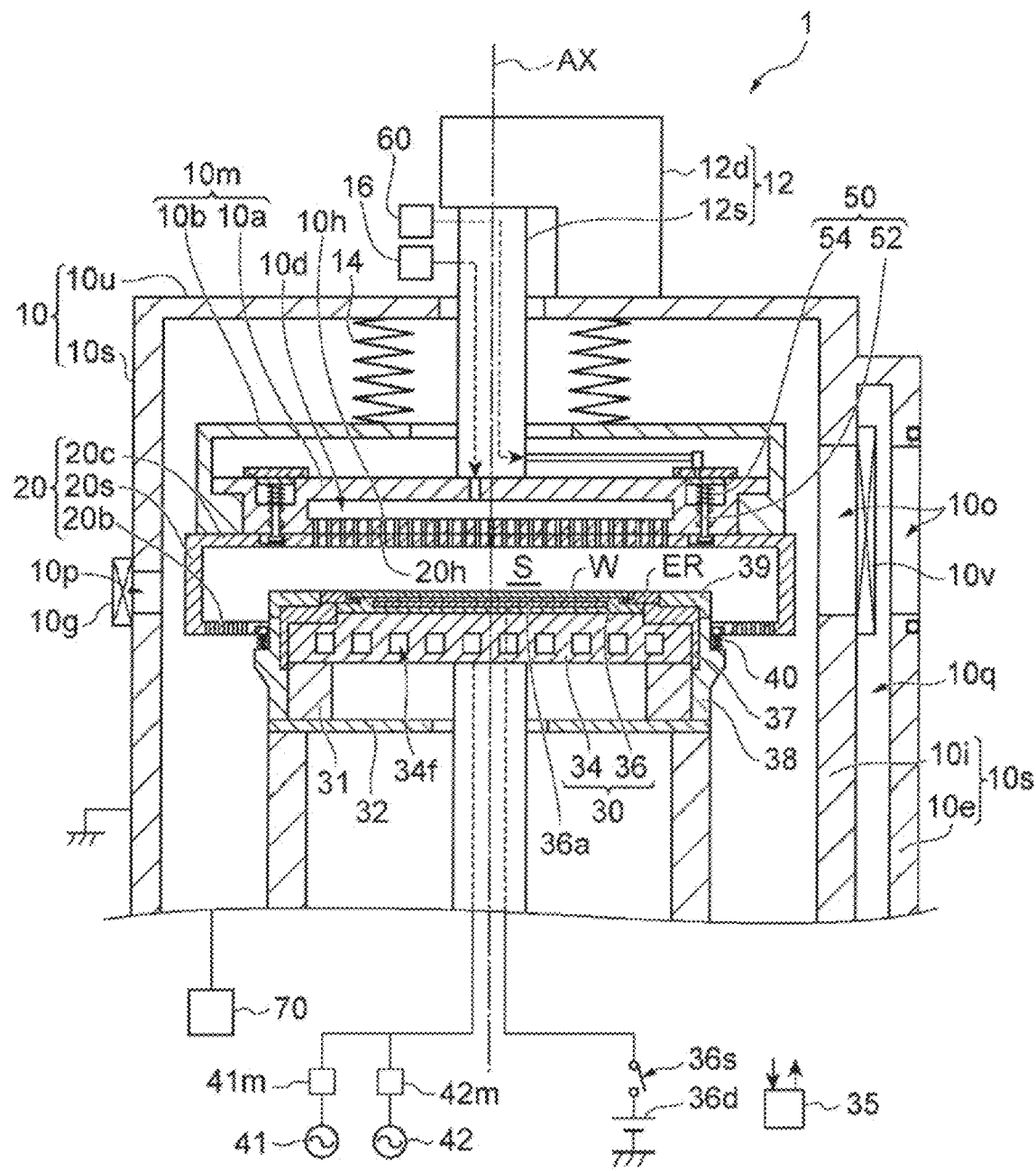
FIG. 2 is a diagram schematically illustrating a substrate processing apparatus according to an exemplary embodiment.
Figure 3:
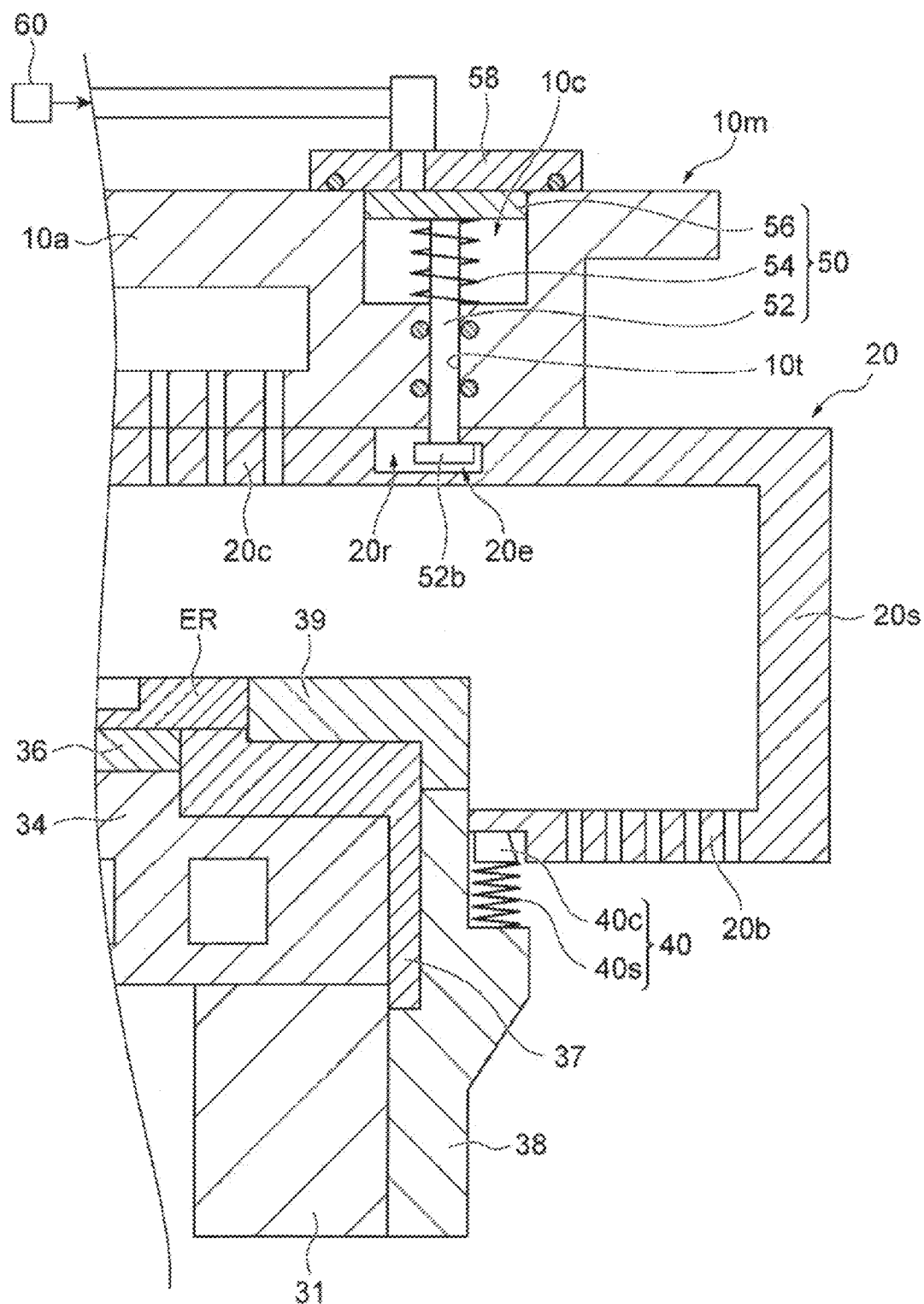
FIG. 3 is a partially enlarged cross-sectional view of the substrate processing apparatus according to an exemplary embodiment.

Hereinafter, a substrate processing apparatus according to an exemplary embodiment will be described. FIG. 2 is a diagram schematically illustrating a substrate processing apparatus according to an exemplary embodiment. FIG. 3 is a partially enlarged cross-sectional view of the substrate processing apparatus according to an exemplary embodiment. A substrate processing apparatus 1 shown in FIGS. 2 and 3 is a capacitively coupled plasma processing apparatus. The substrate processing apparatus 1 includes a first chamber 10, a second chamber 20, and a substrate support 30.

The first chamber 10 provides an inner space. The first chamber 10 is formed of a metal such as aluminum. The first chamber 10 is electrically grounded. A corrosion resistant film may be formed on a surface of the first chamber 10. The corrosion resistant film is formed of, for example, a material such as aluminum oxide or yttrium oxide.

The first chamber 10 includes a sidewall 10s. The sidewall 10s has a substantially cylindrical shape. A central axis line of the sidewall 10s extends in a vertical direction and is shown as an axis line AX in FIG. 2. The sidewall 10s provides a passage 10p. The inner space of the first chamber 10 is connected to an inner space of the transfer chamber TC of the transfer module TM via the passage 10p. The passage 10p may be opened and closed by a gate valve 10g. When the substrate W is transferred between the inner space of the first chamber 10 and the outside of the first chamber 10, the substrate W passes through the passage 10p.

The sidewall 10s further provides an opening 10o. The opening 10o has a size that allows the second chamber 20 to pass therethrough. The inner space of the first chamber 10 may be connected to an inner space of the transfer module CTM via the opening 10o. The opening 10o may be opened and closed by a gate valve 10v.

In an embodiment, a portion of the sidewall 10s has a double structure formed with an inner sidewall 10i and an outer sidewall 10e. The inner sidewall 10i and the outer sidewall 10e provide a space 10q therebetween. The opening 10o is formed in the inner sidewall 10i and the outer sidewall 10e. The gate valve 10v is provided along the inner sidewall 10i to open and close the opening 10o.

The first chamber 10 may further include an upper portion 10u. The upper portion 10u extends from an upper end of the sidewall 10s in a direction intersecting the axis line AX. The upper portion 10u provides an opening in a region which intersects the axis line AX.

The first chamber 10 further includes a movable part 10m. The movable part 10m is provided below the upper portion 10u of the first chamber 10 and inside the sidewall 10s. The movable part 10m is configured to be movable upward and downward within the first chamber 10.

The substrate processing apparatus 1 further includes a lift mechanism 12. The lift mechanism 12 is configured to move the movable part 10m upward and downward. The lift mechanism 12 includes a driving device 12d and a shaft 12s. The movable part 10m is fixed to the shaft 12s. The shaft 12s extends upward from the movable part 10m via the opening of the upper portion 10u. The driving device 12d is provided outside the first chamber 10. The driving device 12d is configured to move the shaft 12s upward and downward. The driving device 12d includes, for example, a motor. The movable part 10m is configured to move upward and downward by the upward and downward movement of the shaft 12s.

The substrate processing apparatus 1 may further include a bellows 14. The bellows 14 is provided between the movable part 10m and the upper portion 10u. The bellows 14 separates the inner space of the first chamber 10 from the outside of the first chamber 10. A lower end of the bellows 14 is fixed to the movable part 10m. An upper end of the bellows 14 is fixed to the upper portion 10u.

In an embodiment, the movable part 10m may include a first member 10a and a second member 10b. The first member 10a and the second member 10b are fixed to each other. The first member 10a has a substantially disk shape. The first member 10a is formed of a conductor such as aluminum. The first member 10a may constitute an upper electrode in the substrate processing apparatus 1. The second member 10b has a substantially cylindrical shape. The second member 10b extends along an outer periphery of the first member 10a and extends above the first member 10a. The lower end of the bellows 14 described above is fixed to an upper end of the second member 10b.

In an embodiment, the movable part 10m may constitute a shower head together with a ceiling portion of the second chamber 20 described later. That is, the movable part 10m may constitute a part of the shower head that supplies gas to a processing space S described later. In the present embodiment, the movable part 10m provides a gas diffusion chamber 10d and a plurality of gas holes 10h.

The gas diffusion chamber 10d may be provided within the first member 10a. A gas supply unit 16 is connected to the gas diffusion chamber 10d. The gas supply unit 16 is provided outside the first chamber 10. The gas supply unit 16 includes one or more gas sources, one or more flow rate controllers, and one or more valves, all of which are used in the substrate processing apparatus 1. Each of the one or more gas sources is connected to the gas diffusion chamber 10d via a corresponding flow rate controller and a corresponding valve. The plurality of gas holes 10h extend downward from the gas diffusion chamber 10d.

The substrate support 30 is disposed within the first chamber 10 and below the movable part 10m. The substrate support 30 is configured to support the substrate W mounted thereon. The substrate support 30 may be supported by a support 31. The support 31 has a substantially cylindrical shape. The support 31 is formed of, for example, an insulator such as quartz. The support 31 may extend upward from a bottom plate 32. The bottom plate 32 may be formed of a metal such as aluminum.

The substrate support 30 may include a lower electrode 34 and an electrostatic chuck 36. The lower electrode 34 has a substantially disk shape. A central axis line of the lower electrode 34 substantially coincides with the axis line AX. The lower electrode 34 is formed of a conductor such as aluminum. The lower electrode 34 provides a flow path 34f therein. For example, the flow path 34f extends in a spiral shape. The flow path 34f is connected to a chiller unit 35.

The chiller unit 35 is provided outside the first chamber 10. The chiller unit 35 supplies a refrigerant to the flow path 34f. The refrigerant supplied to the flow path 34f is returned to the chiller unit 35.

The substrate processing apparatus 1 may further include a first high frequency power source 41 and a second high frequency power source 42. The first high frequency power source 41 is a power source that generates first high frequency power. The first high frequency power has a frequency suitable for generating plasma. The frequency of the first high frequency power is, for example, 27 MHz or more. The first high frequency power source 41 is electrically connected to the lower electrode 34 via a matching unit 41m. The matching unit 41m has a matching circuit for matching an impedance of a load side (lower electrode 34 side) of the first high frequency power source 41 to an output impedance of the first high frequency power source 41. In addition, the first high frequency power source 41 may be connected to the upper electrode, instead of the lower electrode 34, via the matching unit 41m.

The second high frequency power source 42 is a power source that generates second high frequency power. The second high frequency power has a frequency suitable for drawing ions into the substrate W. The frequency of the second high frequency power is, for example, 13.56 MHz or less. The second high frequency power source 42 is electrically connected to the lower electrode 34 via a matching unit 42m. The matching unit 42m has a matching circuit for matching an impedance of a load side (lower electrode 18 side) of the second high frequency power source 42 to an output impedance of the second high frequency power source 42.

The electrostatic chuck 36 is provided on the lower electrode 34. The electrostatic chuck 36 includes a main body and an electrode 36a. The main body of the electrostatic chuck 36 has a substantially disk shape. A central axis line of the electrostatic chuck 36 substantially coincides with the axis line AX. The main body of the electrostatic chuck 36 is made of a ceramic. The substrate W is mounted on an upper surface of the main body of the electrostatic chuck 36. The electrode 36a is a film formed of a conductor. The electrode 36a is provided in the main body of the electrostatic chuck 36. The electrode 36a is connected to a DC power supply 36d via a switch 36s. When a voltage from the DC power supply 36d is applied to the electrode 36a, an electrostatic attractive force is generated between the electrostatic chuck 36 and the substrate W. Due to the generated electrostatic attractive force, the substrate W is attracted to the electrostatic chuck 36 and held by the electrostatic chuck 36. The substrate processing apparatus 1 may provide a gas line for supplying a heat transfer gas (e.g., helium gas) to a gap between the electrostatic chuck 36 and a back surface of the substrate W.

The substrate support 30 may support an edge ring ER disposed thereon. The substrate W is mounted on the electrostatic chuck 36 in a region surrounded by the edge ring ER. The edge ring ER is formed, for example, of silicon, quartz, or silicon carbide.

The substrate processing apparatus 1 may further include an insulating part 37. The insulating part 37 is formed of an insulator such as quartz. The insulating part 37 may have a substantially cylindrical shape. The insulating part 37 extends along an outer periphery of the lower electrode 34 and an outer periphery of the electrostatic chuck 36.

The substrate processing apparatus 1 may further include a conductor part 38. The conductor part 38 is formed of a conductor such as aluminum. The conductor part 38 may have a substantially cylindrical shape. The conductor part 38 is provided along an outer periphery of the substrate support 30. Specifically, the conductor part 38 extends in a circumferential direction from the outside of the insulating part 37 in a radial direction. Each of the radial direction and the circumferential direction is a direction with reference to the axis line AX. The conductor part 38 is connected to the ground. In an example, the conductor part 38 is connected to the ground via the bottom plate 32 and the first chamber 10.

The substrate processing apparatus 1 may further include a cover ring 39. The cover ring 39 is formed of an insulator such as quartz. The cover ring 39 has an annular shape. The cover ring 39 is provided on the insulating part 37 and the conductor part 38 so as to be positioned outside a region where the edge ring ER is disposed in the radial direction.

The substrate processing apparatus 1 may further include a contact 40. The contact 40 is electrically connected to the conductor part 38. The second chamber 20 is in contact with the contact 40 in a state in which the second chamber 20, together with the substrate support 30, defines the processing space S. The processing space S is a space in which the substrate W is processed. In an embodiment, the contact 40 is disposed outside the cover ring 39 in the radial direction and extends upward from the conductor part 38.

The contact 40 may be configured to be in elastic contact with the second chamber 20. As shown in FIG. 3, the contact 40 may have a spring 40s. The contact 40 may further have a contact portion 40c. The spring 40s and the contact portion 40c have conductivity. A lower end of the spring 40s is fixed to the conductor part 38. The spring 40s extends upward from the conductor part 38. The contact portion 40c is fixed to an upper end of the spring 40s. The contact portion 40c is a portion that is in contact with the second chamber 20.

The second chamber 20 is disposed within the first chamber 10 and is configured to define the processing space S together with the substrate support 30. The second chamber 20 is formed of a metal such as aluminum. A corrosion resistant film may be formed on a surface of the second chamber 20. The corrosion resistant film is formed of, for example, a material such as aluminum oxide or yttrium oxide.

The second chamber 20 is removable from the first chamber 10 and transferrable between the inner space of the first chamber 10 and the outside of the first chamber 10 via the opening 10o.

The substrate processing apparatus 1 further includes a clamp 50 and a release mechanism 60. The clamp 50 is configured to releasably fix the second chamber 20 to the first chamber 10. The release mechanism 60 is configured to release the fixing of the second chamber 20 by the clamp 50. Details of the clamp 50 and the release mechanism 60 will be described later.

In an embodiment, the second chamber 20 may include a ceiling portion 20c. The ceiling portion 20c extends substantially horizontally above the processing space S. An upper surface of the ceiling portion 20c is in contact with a lower surface of the movable part 10m in a state in which the second chamber 20 is fixed to the first chamber 10. The ceiling portion 20c provides a plurality of gas holes 20h. The plurality of gas holes 20h pass through the ceiling portion 20c and open toward the processing space S. The plurality of gas holes 20h are respectively connected to the plurality of gas holes 10h.

In an embodiment, the second chamber 20 may further include a side portion 20s. The side portion 20s extends to the side of the processing space S. The side portion 20s has a substantially cylindrical shape. The side portion 20s extends downward from the edge portion of the ceiling portion 20c.

In an embodiment, the second chamber 20 may further include a bottom portion 20b. The bottom portion 20b extends from a lower end of the side portion 20s in a direction intersecting the axis line AX. The bottom portion 20b is in contact with the contact 40 in a state in which the second chamber 20 defines the processing space S together with the substrate support 30.

A plurality of through holes are formed in the bottom portion 20b. The substrate processing apparatus 1 may further include an exhaust device 70. The exhaust device 70 includes a pressure regulator such as an automatic pressure control valve and a decompression pump such as a turbo molecular pump. The exhaust device 70 is connected to a bottom portion of the first chamber 10 under the bottom portion 20b.

Hereinafter, the clamp 50 and the release mechanism 60 will be described. The clamp 50 releasably fixes the ceiling portion 20c of the second chamber 20 to the movable part 10m of the first chamber 10.

As shown in FIGS. 2 and 3, in an embodiment, the clamp 50 includes a plurality of supports 52 and a plurality of springs 54. The clamp 50 may further include a plate 56. In addition, each of the number of the supports 52 and the number of the springs 54 of the clamp 50 may be one.

Each of the plurality of supports 52 has a lower end 52b. The lower end 52b is formed so that the ceiling portion 20c is suspended therefrom. The plurality of springs 54 are provided so as to urge the ceiling portion 20c to the movable part 10m of the first chamber 10.

In an embodiment, the movable part 10m of the first chamber 10 provides a cavity 10c. The cavity 10c may extend in the circumferential direction around the axis line AX. The cavity 10c is closed by a lid 58. The lid 58 is provided on the movable part 10m of the first chamber 10 so as to close the cavity 10c. The movable part 10m further provides a plurality of holes 10t. The plurality of holes 10t may be arranged at equal intervals around the axis line AX. The plurality of holes 10t extend downward from the cavity 10c and open toward the ceiling portion 20c. The ceiling portion 20c provides a plurality of recesses 20r. The plurality of recesses 20r are respectively connected to the plurality of holes 10t in a state in which the second chamber 20 is fixed to the first chamber 10.

In an embodiment, each of the plurality of supports 52 has a rod shape. The lower end 52b of each of the plurality of supports 52 protrudes in a horizontal direction. Each bottom portion of the plurality of recesses 20r includes an extension portion 20e. The extension portion 20e is formed so that the lower end 52b of the corresponding support of the plurality of supports 52 may be positioned therein. In an example, each of the plurality of supports 52 may be a screw, and the lower end 52b of each of the plurality of supports 52 may be a screw head.

The plurality of supports 52 extend downward from the cavity 10c through the plurality of holes 10t. In a state in which the ceiling portion 20c is suspended from the plurality of supports 52, the lower ends 52b of the plurality of supports 52 are respectively disposed within the plurality of recesses 20r and their extension portions 20e.

The upper ends of the plurality of supports 52 are fixed to the plate 56 within the cavity 10c. The plurality of springs 54 are disposed within the cavity 10c. The plurality of springs 54 are disposed between the plate 56 and a surface of the movable part 10m defining the cavity 10c from below.

In an embodiment, each of the plurality of springs 54 is a coil spring. Each of the plurality of springs 54 is provided to surround the plurality of supports 52 within the cavity 10c.

In an embodiment, the release mechanism 60 includes an air supply device. In order to release the fixing of the ceiling portion 20c by the clamp 50, the air supply device applies air pressure to separate the lower end 52b of each of the plurality of supports 52 from the second chamber 20. The air supply device of the release mechanism 60 may supply air to a gap between the lid 58 and the plate 56. When the air is supplied to the gap between the lid 58 and the plate 56, the plate 56 and the plurality of supports 52 move downward, and the lower end 52b of each of the plurality of supports 52 is separated from the second chamber 20. That is, the fixing of the ceiling portion 20c by the clamp 50 is released. In a state in which the fixing of the ceiling portion 20c by the clamp 50 is released, the fixing of the second chamber 20 to the first chamber 10 is released, and the second chamber 20 may be transferred from the inner space of the first chamber 10 to the outside of the first chamber 10.

Figure 4:
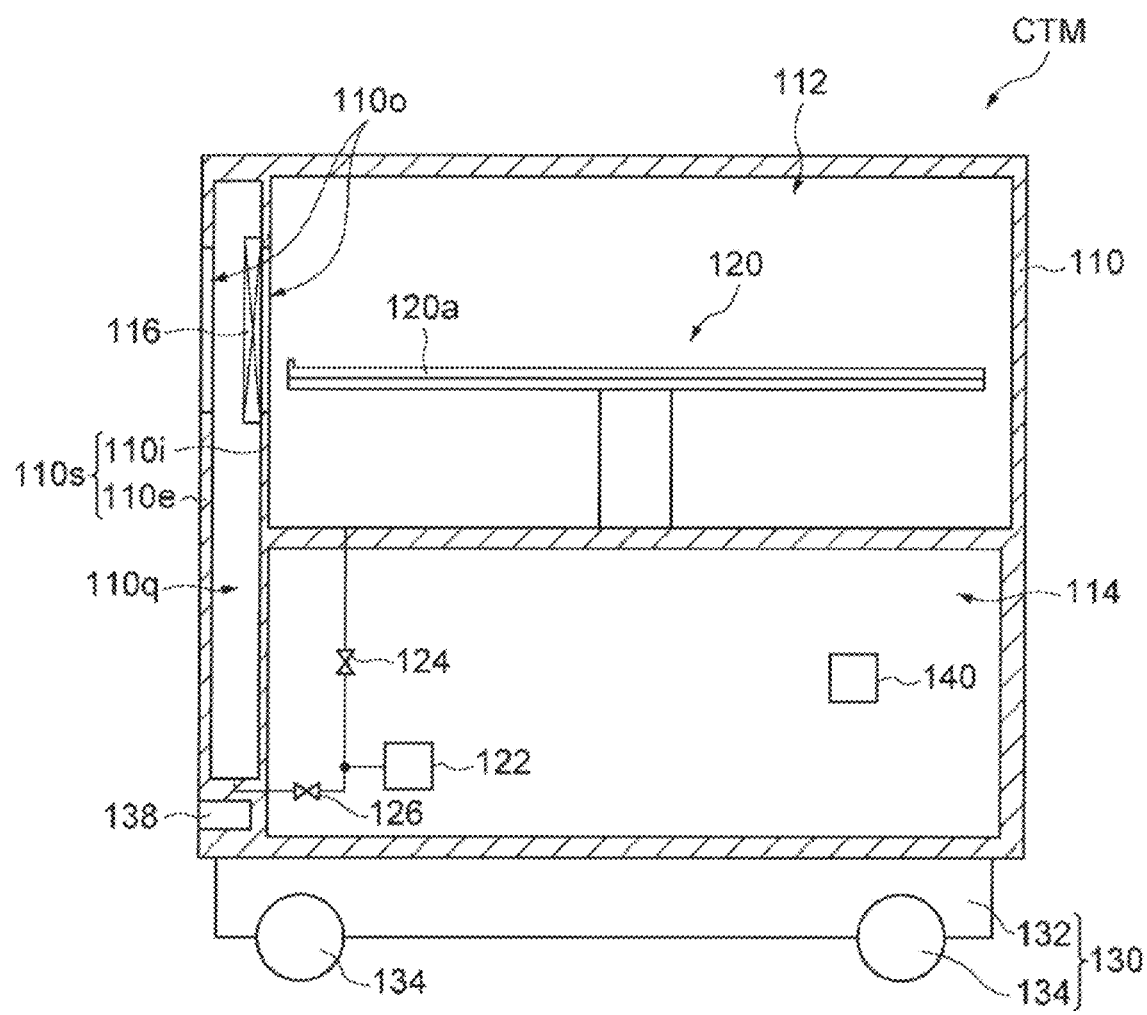
FIG. 4 is a diagram schematically illustrating a transfer module of the substrate processing system according to an exemplary embodiment.

Hereinafter, the transfer module CTM will be described. FIG. 4 is a diagram schematically illustrating a transfer module of a substrate processing system according to an exemplary embodiment. The transfer module CTM includes a chamber 110. The chamber 110 provides an inner space 112 and an inner space 114. The inner space 112 is provided above the inner space 114 and is separated from the inner space 114. A sidewall 110s of the chamber 110 provides a continuous opening 110o in the inner space 112. The opening 110o may be opened and closed by a gate valve 116.

In an embodiment, a portion of the sidewall 110s has a double structure formed of an inner sidewall 110i and an outer sidewall 110e. The inner sidewall 110i and the outer sidewall 110e provide a space 110q therebetween. The opening 110o is formed in the inner sidewall 110i and the outer sidewall 110e. A gate valve 110v is provided along the inner sidewall 110i to open and close the opening 110o.

The transfer module CTM further has a transfer device 120. The transfer device 120 is a transfer robot and includes an arm 120a. The transfer device 120 is provided within the inner space 112.

The transfer module CTM further has an exhaust device 122. The exhaust device 122 is provided in the inner space 114. The exhaust device 122 is connected to the inner space 112 via a valve 124 and is connected to the space 110q via a valve 126. The exhaust device 122 is configured to depressurize the inner space 112 and the space 110q.

The transfer module CTM further has a moving mechanism 130. The moving mechanism 130 has a main body 132 and a plurality of wheels 134. The main body 132 has a power source such as a battery, a mechanical power source, and a steering mechanism embedded therein. The wheels 134 are rotated by the mechanical power source in the main body 132, and move the transfer module CTM in a direction controlled by the steering mechanism in the main body 132. In addition, the moving mechanism 130 may be a mechanism to which a type other than the wheel 134 such as a walking type is applied, as long as the transfer module CTM may be moved.

The transfer module CTM further has a sensor 138 and a control unit 140. The sensor 138 is mounted on an outer wall of the chamber 110. The control unit 140 is provided within the inner space 114. The sensor 138 senses the environment around the transfer module CTM and outputs a sensing result to the control unit 140. The sensor 138 is, for example, an image sensor and outputs an image around the transfer module CTM to the control unit 140. The control unit 140 may be a computer having a processor, a storage device such as a memory, and a communication unit. The control unit 140 is configured to control each part of the transfer module CTM. In order to connect the transfer module CTM to the substrate processing apparatus 1, the control unit 140 controls the moving mechanism 130 using the sensing result of the sensor 138 to move the transfer module CTM. In addition, the control unit 140 controls the exhaust device 122 and the valves 124 and 126.

Hereinafter, a maintenance method according to an exemplary embodiment will be described with reference to FIGS. 5 to 13. In addition, control of the control unit MC for the maintenance method will be described. Each of FIGS. 5 to 10 and FIGS. 12 and 13 is a diagram illustrating a state of a substrate processing system during execution of the maintenance method according to an exemplary embodiment. FIG. 11 is a partially enlarged cross-sectional view of a substrate processing apparatus according to an exemplary embodiment. In the maintenance method, the second chamber 20 is separated from the first chamber 10 for maintenance thereof and is transferred from the inner space of the first chamber 10 to an inner space of the chamber 110 of the transfer module CTM.

The maintenance method starts in a state in which the second chamber 20 is fixed to the movable part 10m and the second chamber 20 defines the processing space S together with the substrate support 30. In this state, the second chamber 20 is in contact with the contact 40 and is connected to the ground.

Figure 5:
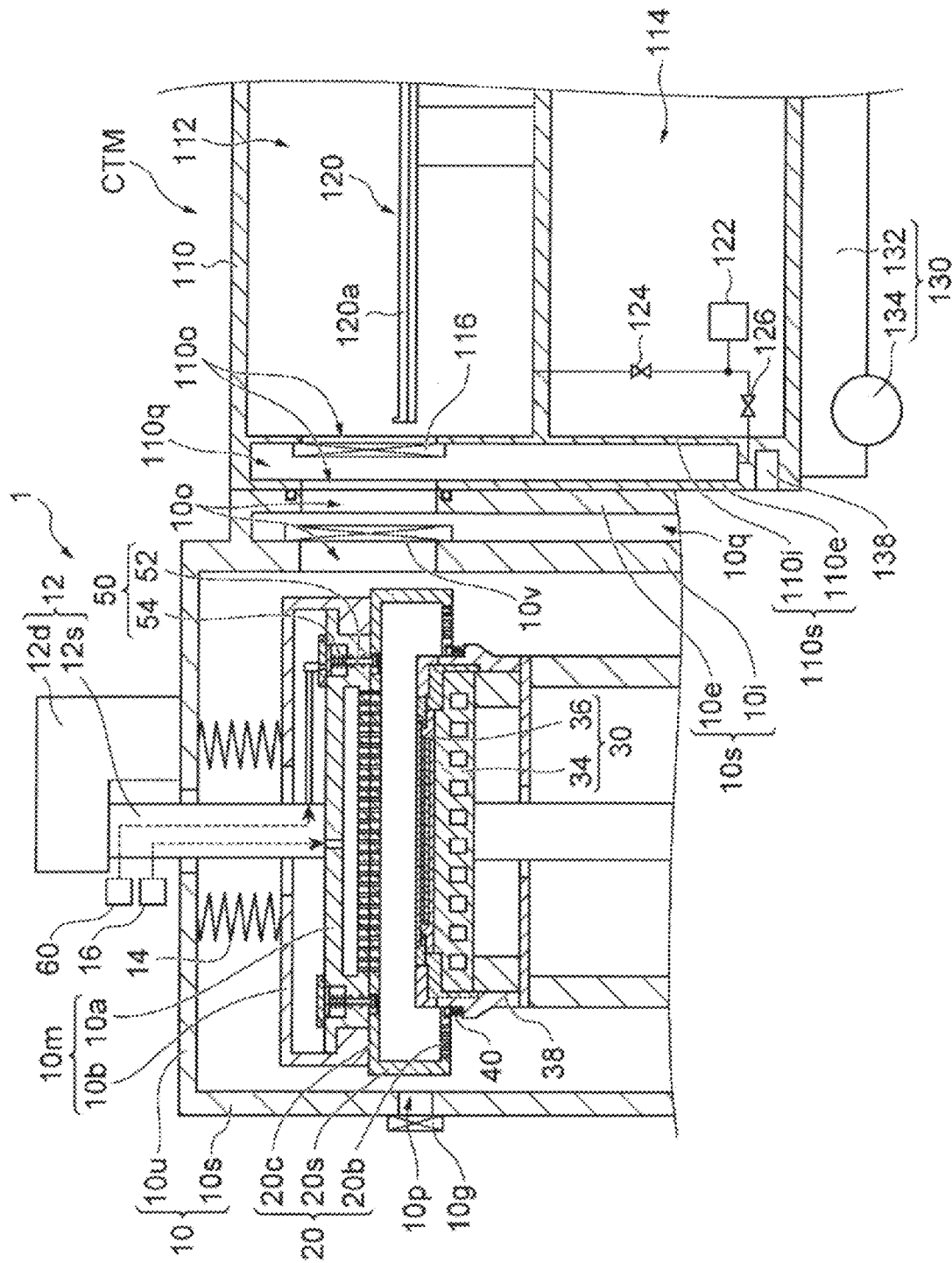
FIG. 5 is a diagram illustrating a state of a substrate processing system during execution of a maintenance method according to an exemplary embodiment.

First, in the maintenance method, the transfer module CTM is moved, and as shown in FIG. 5, the chamber 110 of the transfer module CTM is connected to the first chamber 10 of the substrate processing apparatus 1. The first chamber 10 and the chamber 110 are connected so that the opening 10o and 25 the opening 110o are aligned. As described above, in order to move the transfer module CTM, the control unit MC controls the transfer module CTM. Specifically, the moving mechanism 130 is controlled by the control unit 140 receiving a command from the control unit MC, and the transfer module CTM is moved.

In a state in which the chamber 110 is connected to the first chamber 10, the sidewall 10s, the gate valve 10v, the sidewall 110s, and the gate valve 110v define a sealed space. The sealed space includes the space 10q and the space 110q. In the maintenance method, the enclosed space is depressurized by the exhaust device 122. At the same time, the inner space 112 of the chamber 110 of the transfer module CTM is also depressurized by the exhaust device 122. For depressurizing of the sealed space and the inner space 112, the exhaust device 122 is controlled by the control unit MC. Specifically, the exhaust device 122 is controlled by the control unit 140 receiving a command from the control unit MC.

Figure 6:
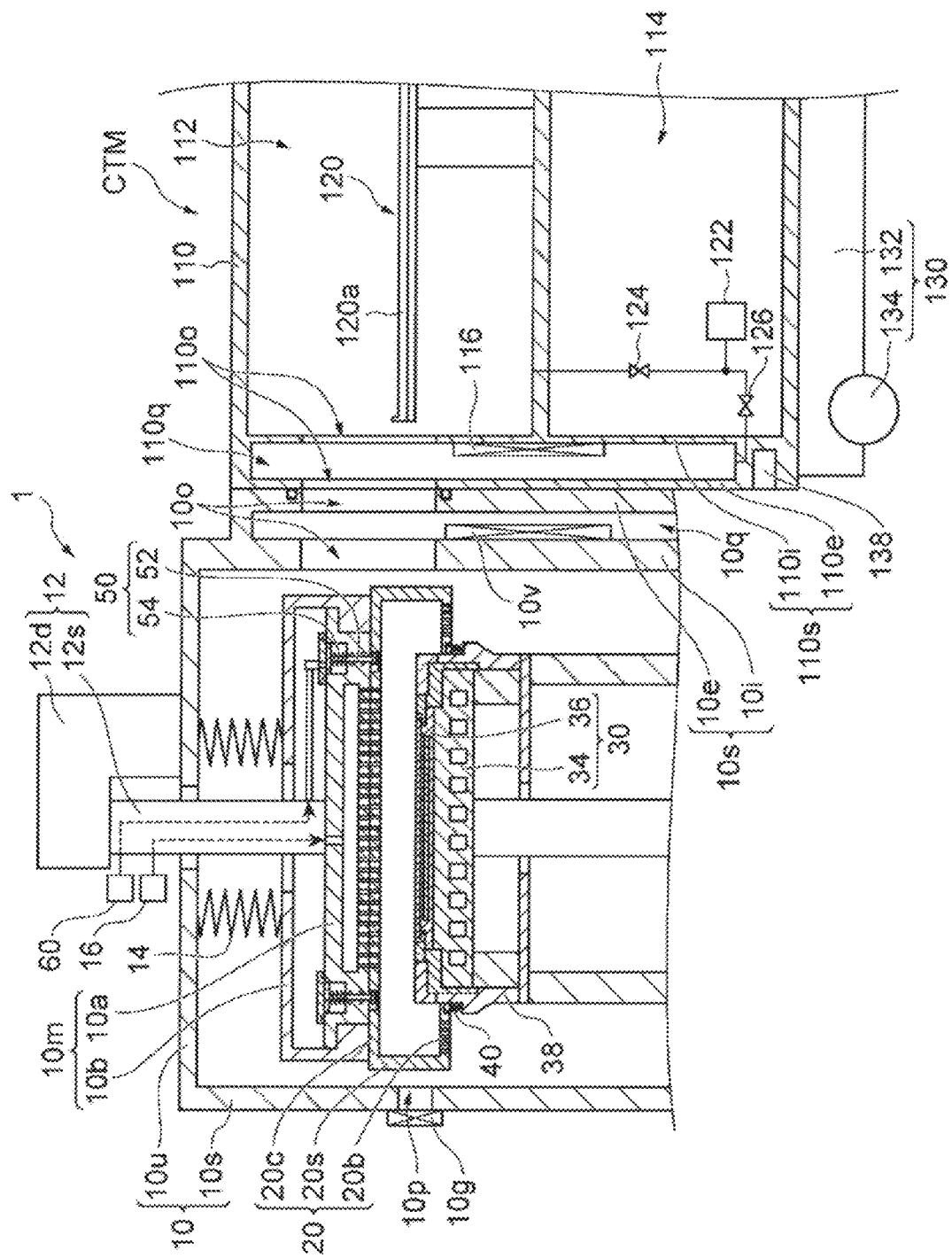
FIG. 6 is a diagram illustrating a state of the substrate processing system during execution of the maintenance method according to an exemplary embodiment.

Next, in the maintenance method, as shown in FIG. 6, the gate valve 10v and the gate valve 116 are moved in order to communicate the inner space of the first chamber 10 and the inner space 112 of the chamber 110 of the transfer module CTM. The opening 10o and the opening 110o are opened by movement of the gate valve 10v and the gate valve 116. The gate valve 10v and the gate valve 116 are controlled by the control unit MC for their movement. The gate valve 116 is controlled by the control unit 140 receiving a command from the control unit MC.

Figure 7:
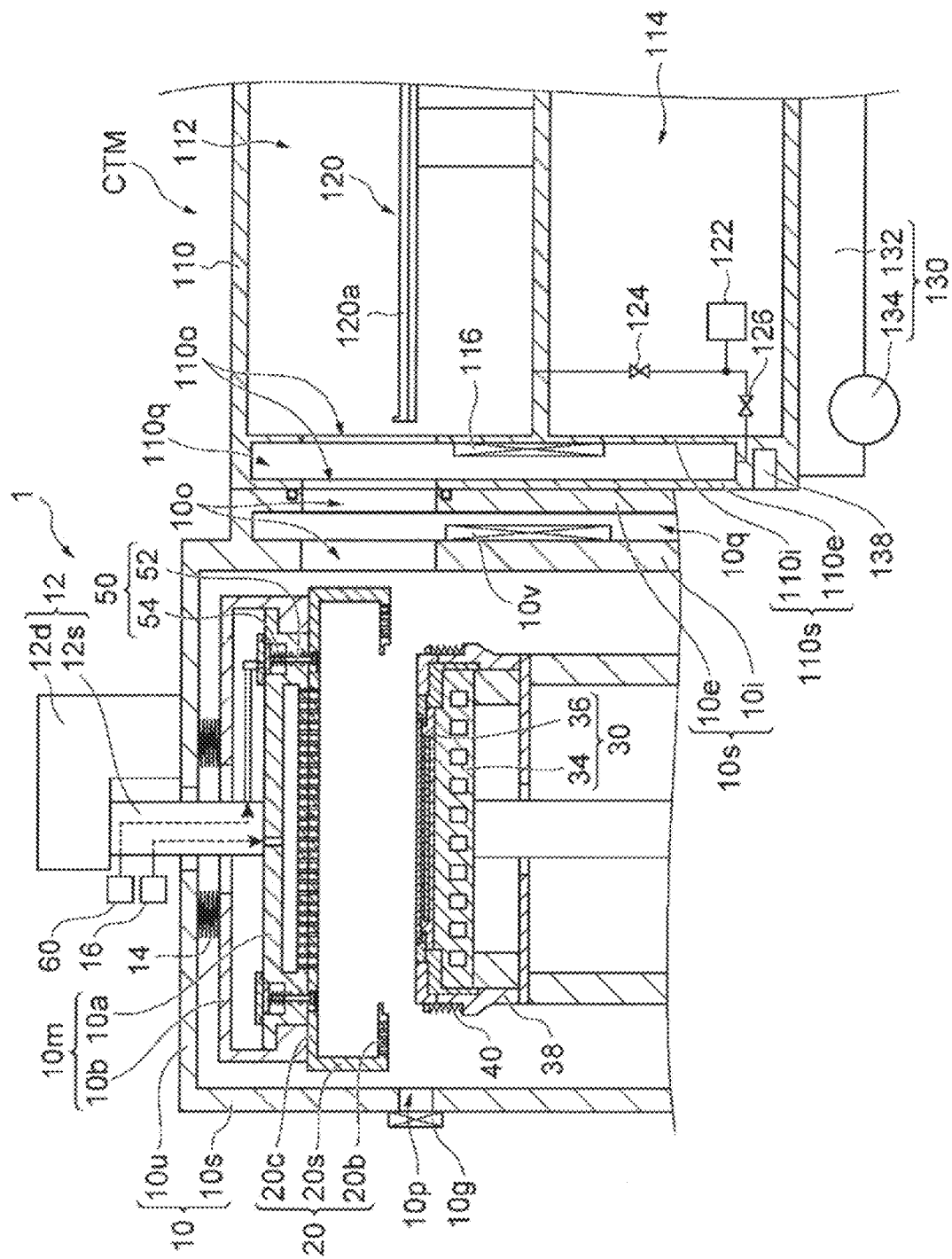
FIG. 7 is a diagram illustrating a state of the substrate processing system during execution of the maintenance method according to an exemplary embodiment.

Then, in the maintenance method, as shown in FIG. 7, the movable part 10m and the second chamber 20 are separated upward from the substrate support 30 within the first chamber 10. The movable part 10m and the second chamber 20 are moved upward by the lift mechanism 12. The lift mechanism 12 is controlled by the control unit MC in order to move the movable part 10*m* and the second chamber 20 upward. In addition, in the state shown in FIG. 7, that is, in the state in which the second chamber 20 is separated upward from the substrate support 30, the second chamber 20 is also separated from the contact 40.

Figure 8:
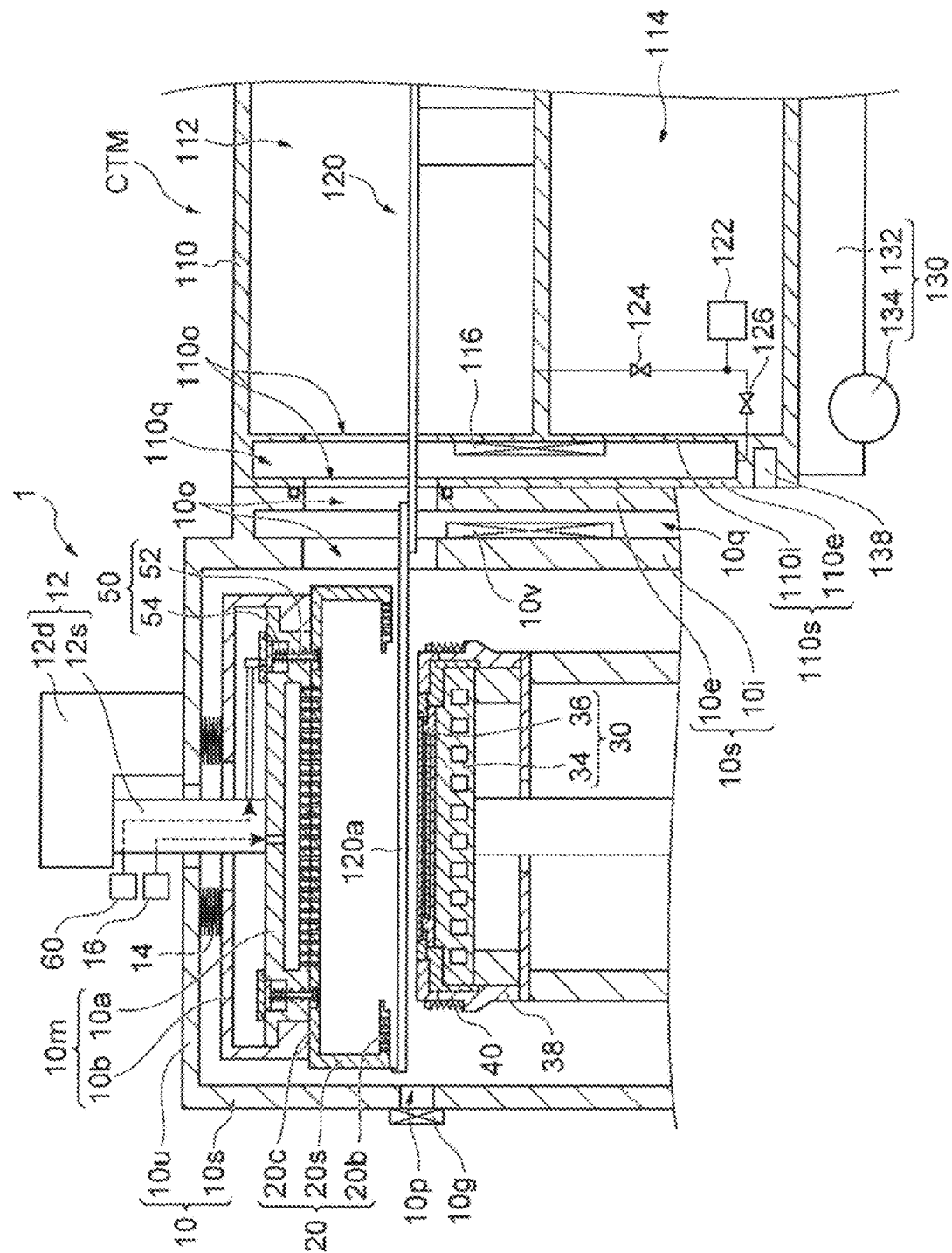
FIG. 8 is a diagram illustrating a state of the substrate processing system during execution of the maintenance method according to an exemplary embodiment.

Then, in the maintenance method, as shown in FIG. 8, the arm 120*a* of the transfer device 120 enters the inner space of the first chamber 10 so as to extend from the inner space 112 of the chamber 110 of the transfer module CTM to a lower side of the second chamber 20. Accordingly, the transfer device 120 is controlled by the control unit MC. Specifically, the transfer device 120 is controlled by the control unit 140 receiving a command from the control unit MC.

Figure 9:
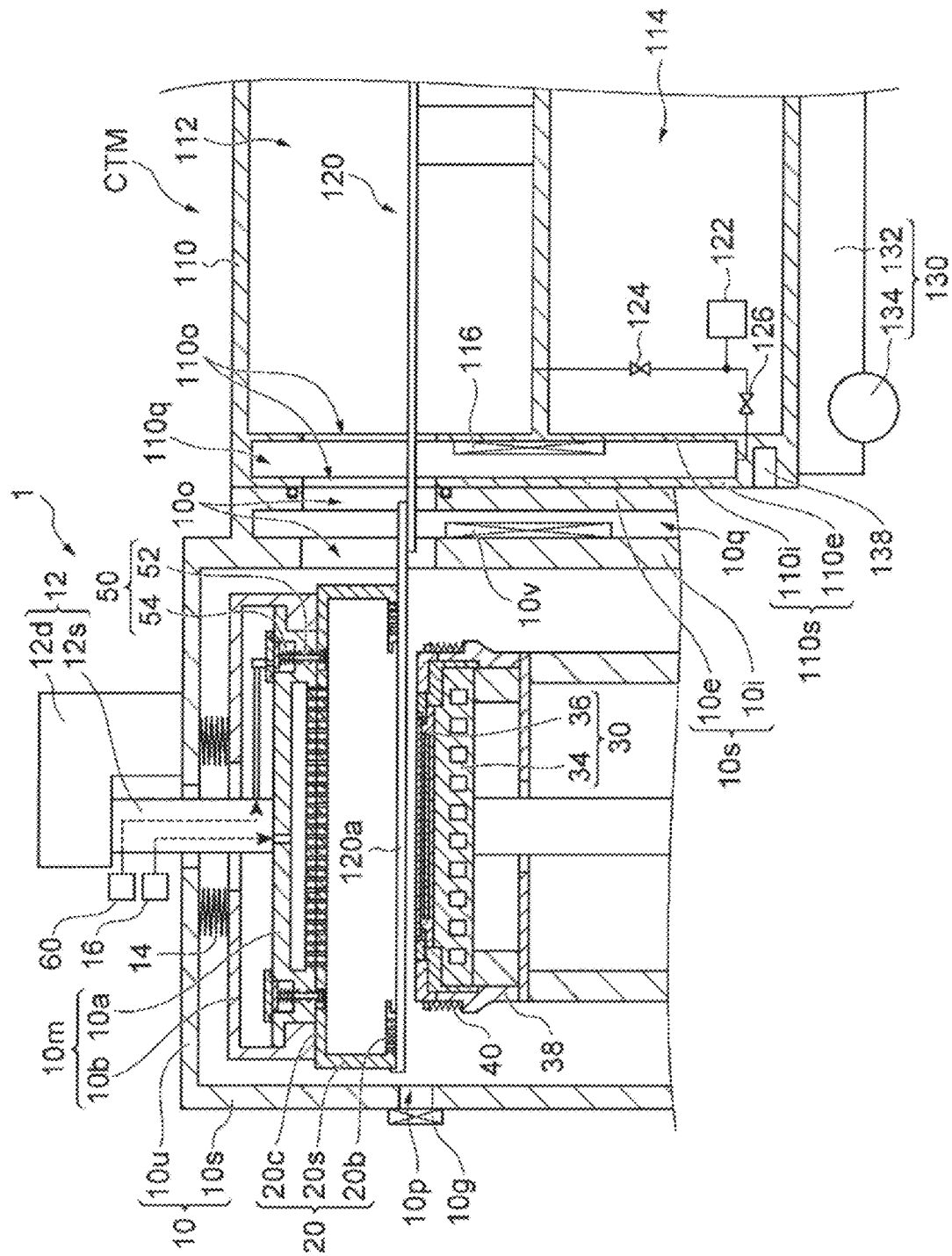
FIG. 9 is a diagram illustrating a state of the substrate processing system during execution of the maintenance method according to an exemplary embodiment.

Then, in the maintenance method, as shown in FIG. 9, the movable part 10*m* and the second chamber 20 are moved downward by the lift mechanism 12, and the second chamber 20 is placed on the arm 120*a*. The lift mechanism 12 is controlled by the control unit MC in order to move the movable part 10*m* and the second chamber 20 downward.

Figure 10:
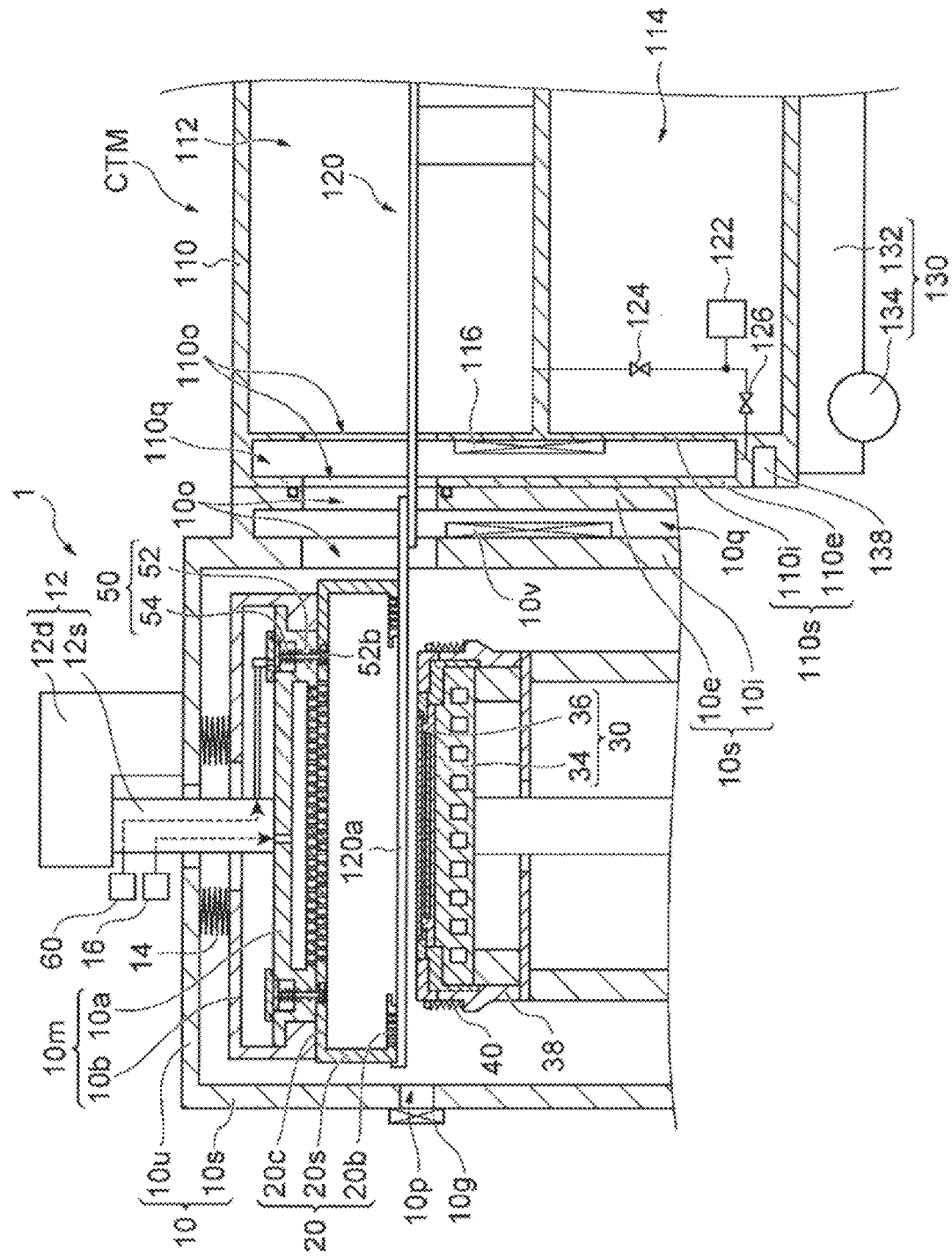
FIG. 10 is a diagram illustrating a state of the substrate processing system during execution of the maintenance method according to an exemplary embodiment.
Figure 11:
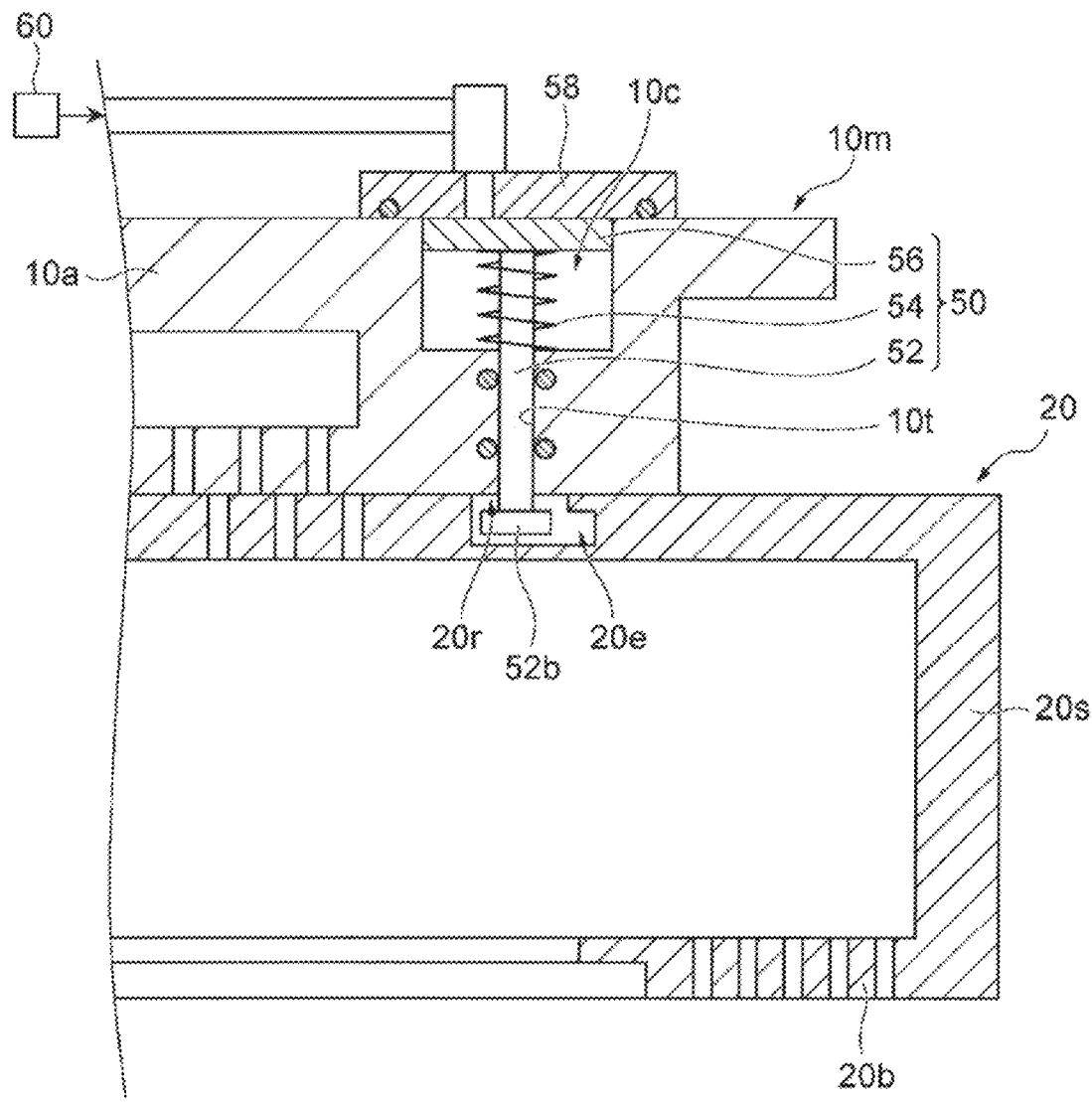
FIG. 11 is a partially enlarged cross-sectional view of the substrate processing apparatus according to an exemplary embodiment.

Then, in the maintenance method, as shown in FIGS. 10 and 11, the fixing of the second chamber 20 by the clamp 50 is released. The fixing of the second chamber 20 by the clamp 50 is released by the release mechanism 60. In an example, the release mechanism 60 supplies air from the air supply device to the gap between the lid 58 and the plate 56. As a result, the fixing of the second chamber 20 by the clamp 50 is released. In order to release the fixing of the second chamber 20 by the clamp 50, the release mechanism 60 is controlled by the control unit MC.

In addition, as shown in FIGS. 10 and 11, the second chamber 20 is moved in the horizontal direction by the transfer device 120. Accordingly, the lower ends 52*b* of the plurality of supports 52 are retracted from the extension portions 20*e*. In order to move the second chamber 20 in the horizontal direction, the transfer device 120 is controlled by the control unit MC. Specifically, the transfer device 120 is controlled by the control unit 140 receiving a command from the control unit MC.

Figure 12:
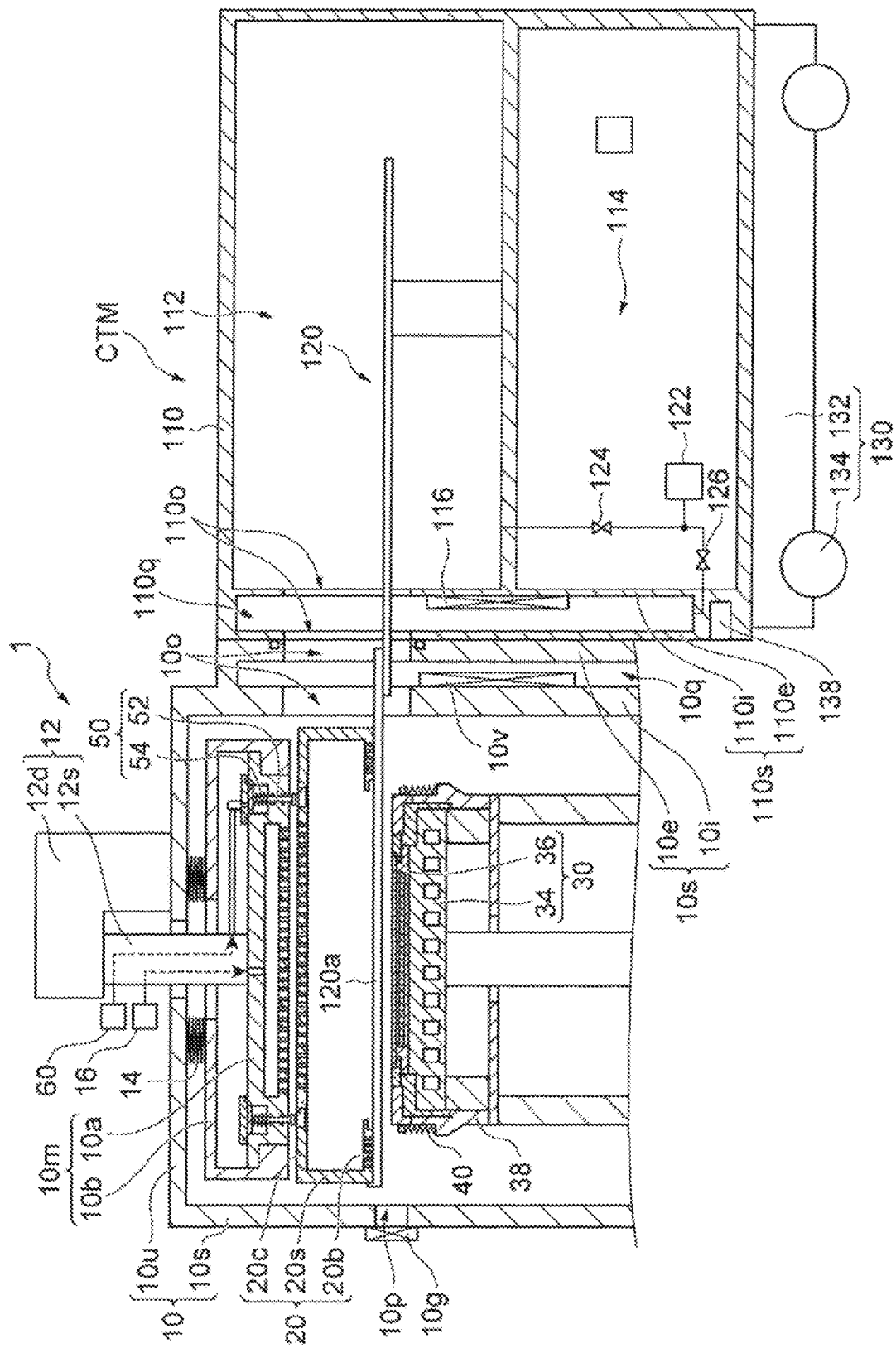
FIG. 12 is a diagram illustrating a state of the processing system during execution of the substrate maintenance method according to an exemplary embodiment.

Then, in the maintenance method, as shown in FIG. 12, the movable part 10*m* is moved upward and separated from the second chamber 20. The movable part 10*m* is moved upward by the lift mechanism 12. The lift mechanism 12 is controlled by the control unit MC in order to move the movable part 10*m* upward.

Figure 13:
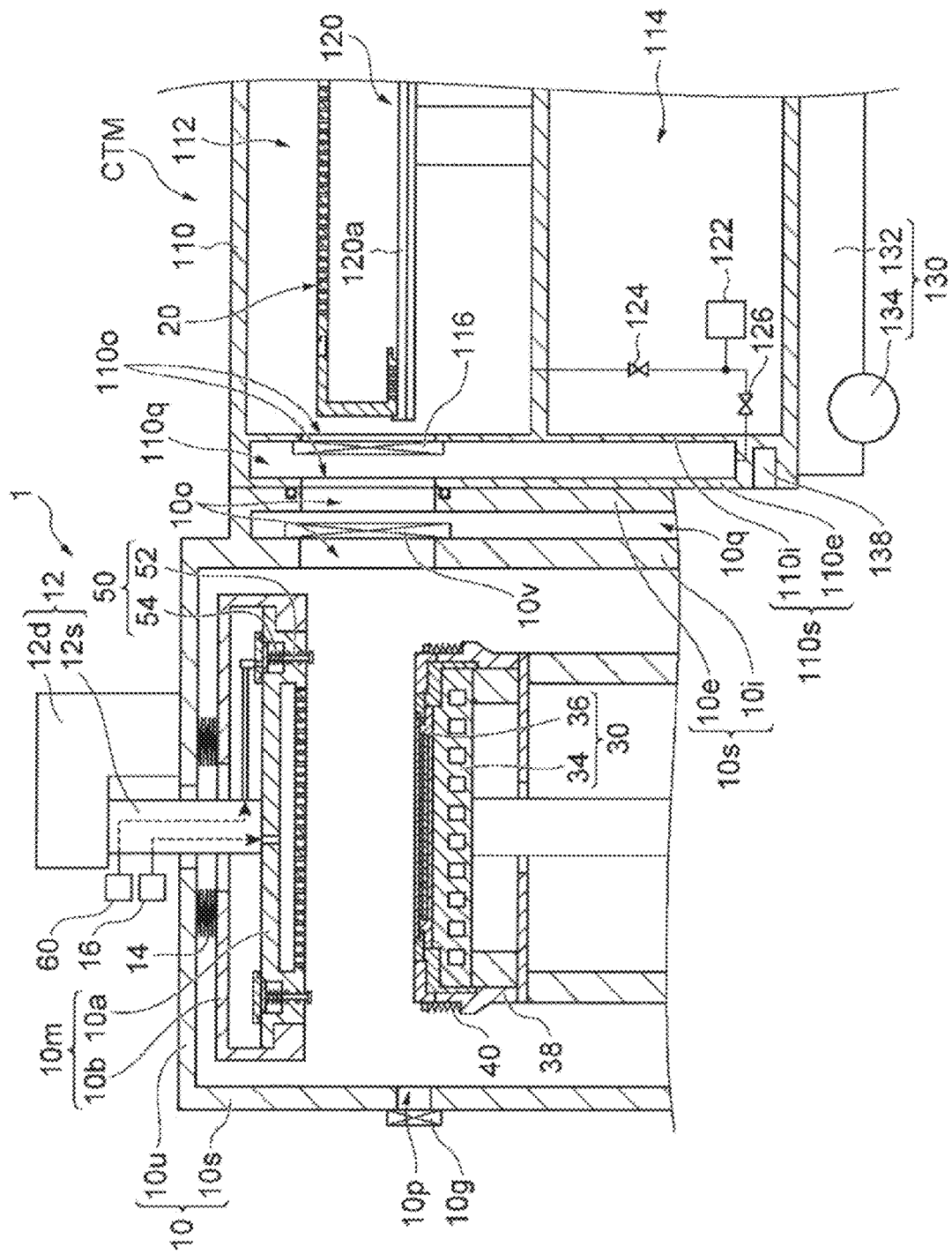
FIG. 13 is a diagram illustrating a state of the substrate processing system during execution of the maintenance method according to an exemplary embodiment.

Then, in the maintenance method, as shown in FIG. 13, the second chamber 20 is moved from the inner space of the first chamber 10 to the inner space 112 of the chamber 110 of the transfer module CTM via the opening 10*o* and the opening 110*o*. Accordingly, the arm 120*a* of the transfer device 120 is returned into the inner space 112 of the chamber 110 of the transfer module CTM. The transfer device 120 is controlled by the control unit MC to transfer the second chamber 20. Specifically, the transfer device 120 is controlled by the control unit 140 receiving a command from the control unit MC.

Then, as shown in FIG. 13, the gate valve 10*v* and the gate valve 116 are moved, and the opening 10*o* and the opening 110*o* are closed. The gate valve 10*v* and the gate valve 116 are controlled by the control unit MC for their movement. The gate valve 116 is controlled by the control unit 140 receiving a command from the control unit MC.

As described above, in the substrate processing apparatus 1, the substrate W is processed within the second chamber 20. The second chamber 20 is disposed within the first chamber 10 and is fixed to the first chamber 10. The fixing of the second chamber 20 to the first chamber 10 may be released using the release mechanism 60. In addition, in a state in which the fixing of the second chamber 20 to the first chamber 10 is released, it is possible to carry out the second chamber 20 to the outside of the first chamber 10 from the opening 10*o* provided in the sidewall of the first chamber 10. Therefore, it is possible to easily maintain the second chamber 20 defining the processing space S.

In addition, according to the substrate processing system PS and the maintenance method described above, it is possible to carry out the second chamber 20 automatically from the inner space of the first chamber 10. Therefore, a non-operation period of the substrate processing system PS due to maintenance (e.g., replacement) of the second chamber 20 is shortened.

Figure 14:
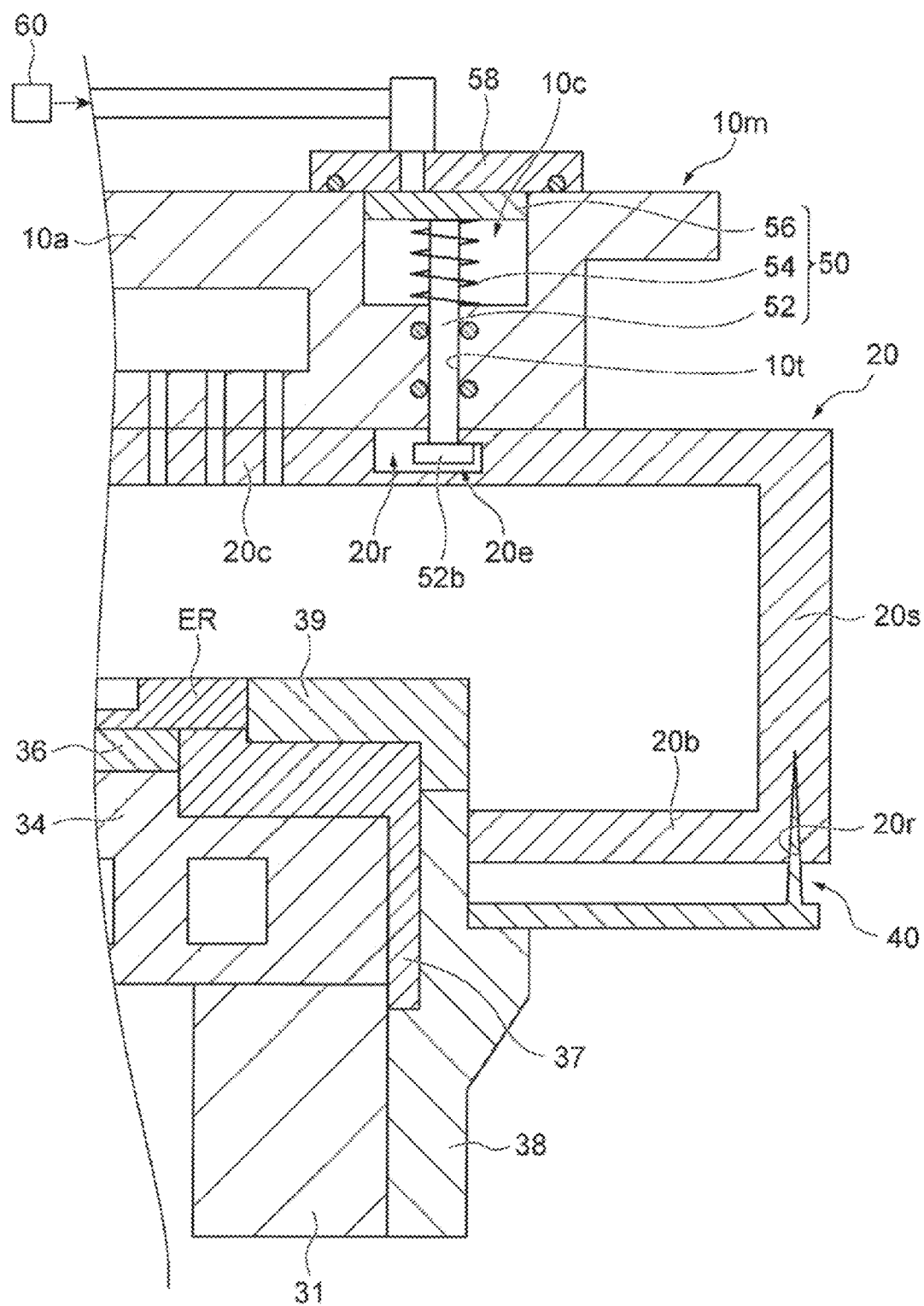
FIG. 14 is a partially enlarged cross-sectional view of a substrate processing apparatus according to another exemplary embodiment.

Hereinafter, reference is made to FIG. 14. FIG. 14 is a partially enlarged cross-sectional view of a substrate processing according apparatus to another exemplary embodiment. In the substrate processing apparatus shown in FIG. 14, the configuration of the contact 40 is different from the configuration of the contact 4 substrate processing apparatus 1. In the substrate processing apparatus shown in FIG. 14, the contact 40 is a pin. The second chamber 20 provides a recess 20*r* into which the pin of the contact 40 is fitted. In an embodiment, the pin of the contact 40 may have a tapered shape. The recess 20*r* of the second chamber 20 may have a tapered shape corresponding to the tapered shape of the pin of the contact 40. Other configurations of the substrate processing apparatus shown in FIG. 14 may be the same as the corresponding configurations of the substrate processing apparatus 1.

Figure 15:
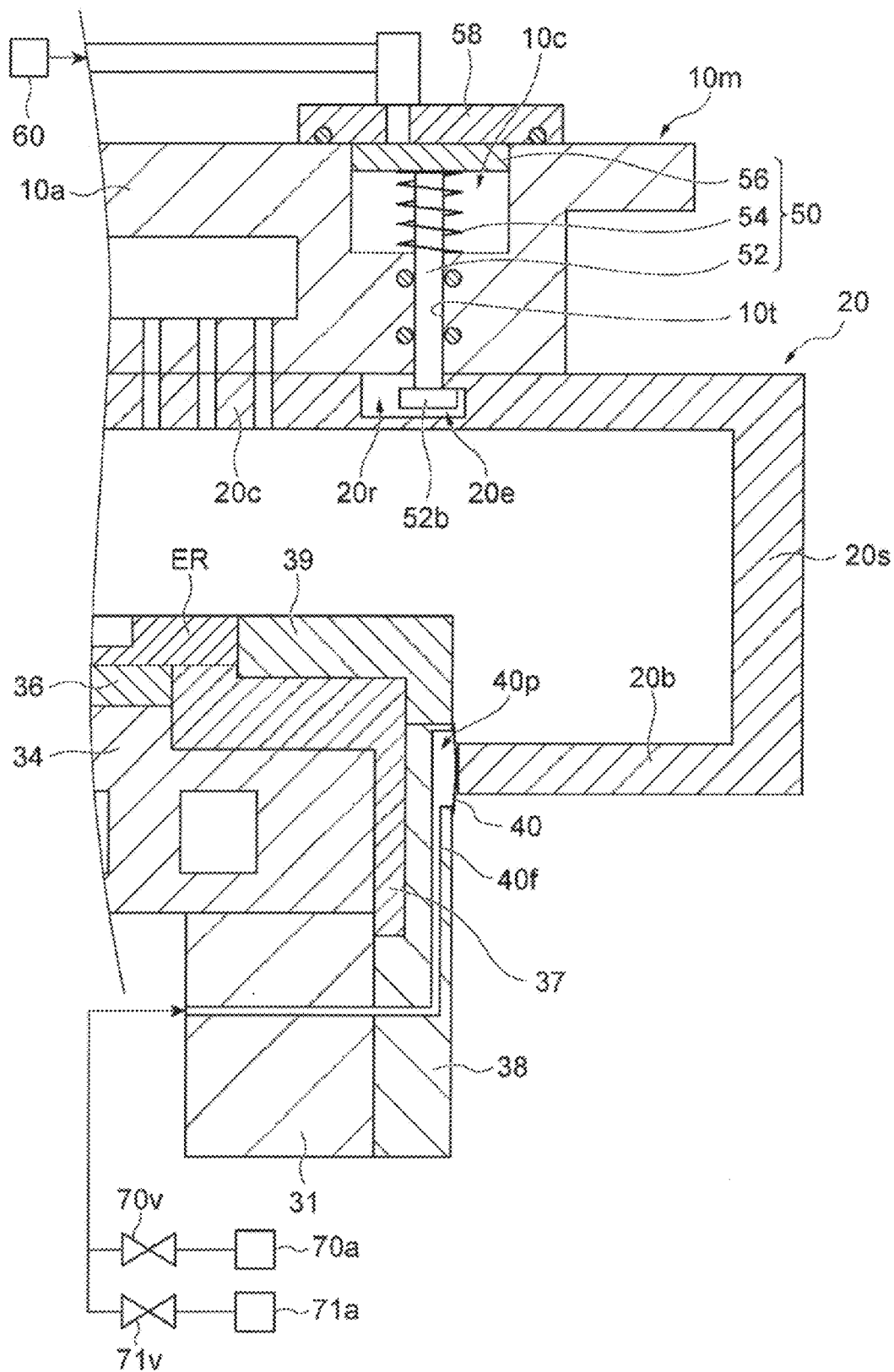
FIG. 15 is a partially enlarged cross-sectional view of a substrate processing apparatus according to still another exemplary embodiment.

Hereinafter, reference is made to FIG. 15. FIG. 15 is a partially enlarged cross-sectional view of a substrate processing apparatus according to still another exemplary embodiment. In the substrate processing apparatus shown in FIG. 15, the configuration of the contact 40 is different from the configuration of the contact 40 of the substrate processing apparatus 1. In the substrate processing apparatus shown in FIG. 15, the contact 40 includes a film. The film of the contact 40 has flexibility and is formed of a conductive material. The film of the contact 40 is mounted on an outer peripheral surface of the conductor part 38. The film of the contact 40 forms a pressure chamber 40*p* within the conductor part 38 together with the conductor part 38.

The substrate processing apparatus 1 shown in FIG. 15 provides a flow path 40*f*. The flow path 40*f* is connected to the pressure chamber 40*p*. The flow path 40*f* is partially formed within the conductor part 38. The substrate processing apparatus 1 shown in FIG. 15 further includes an air supply device 70*a* and an exhaust device 71*a*. The air supply device 70*a* is connected to the flow path 40*f* via a valve 70*v*. The exhaust device 71*a* is a device such as a dry pump and is connected to the flow path 40*f* via a valve 71*v*. The air supply device 70*a* supplies air to the pressure chamber 40*p*. That is, the air supply device 70*a* is configured to apply air pressure to the film of the contact 40 to press the corresponding film to the second chamber 20. In the shown example, the film of the contact 40 may be pressed against the inner edge portion of the bottom portion 20*b* of the second chamber 20. When the air in the pressure chamber 40*p* is exhausted by the exhaust device 71*a*, the film of the contact 40 is separated from the second chamber 20. Other configurations of the substrate processing apparatus shown in FIG. 15 may be the same as the corresponding configurations of the substrate processing apparatus 1.

Figure 16:
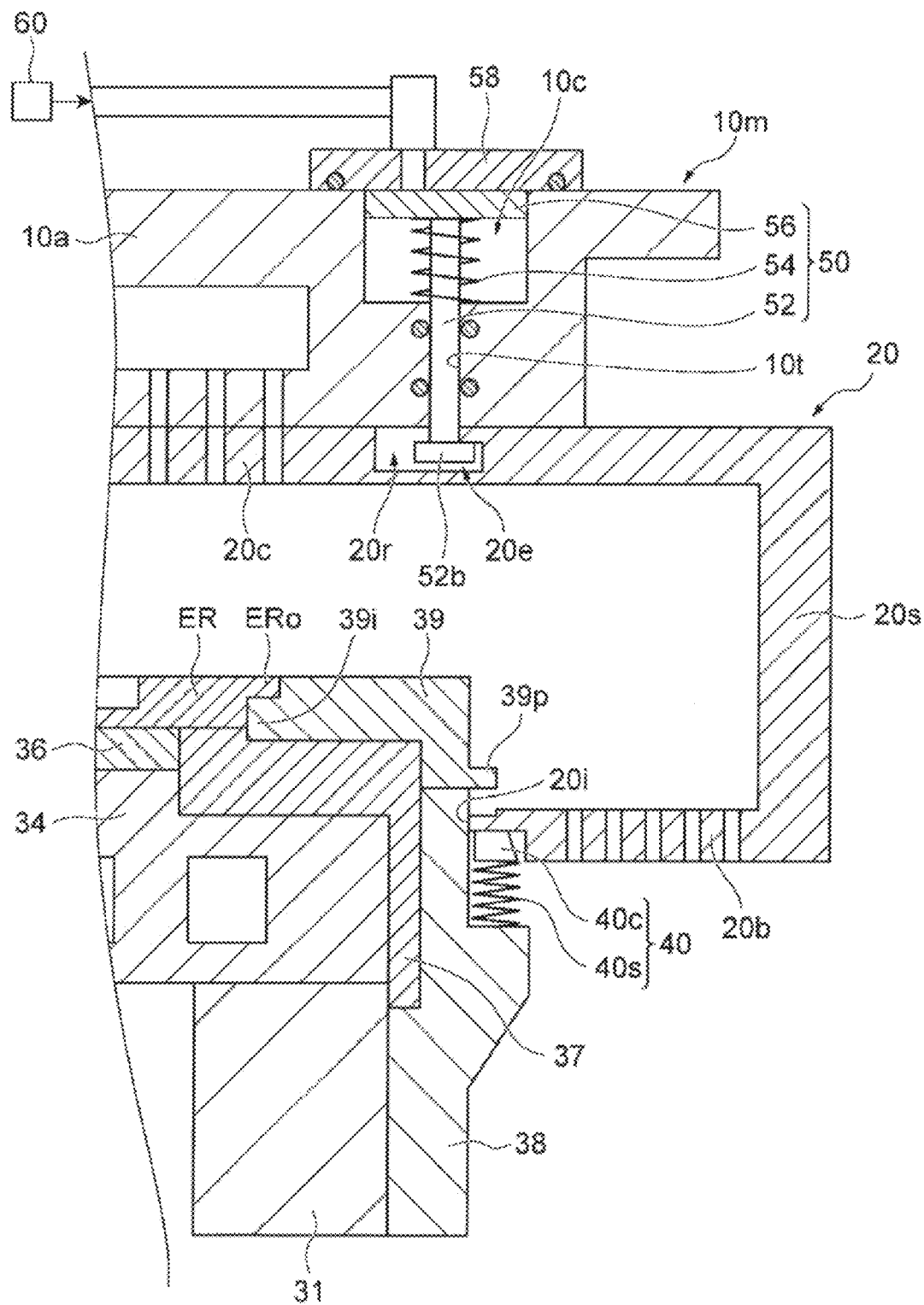
FIG. 16 is a partially enlarged cross-sectional view of a substrate processing apparatus according to yet another exemplary embodiment.
Figure 17:
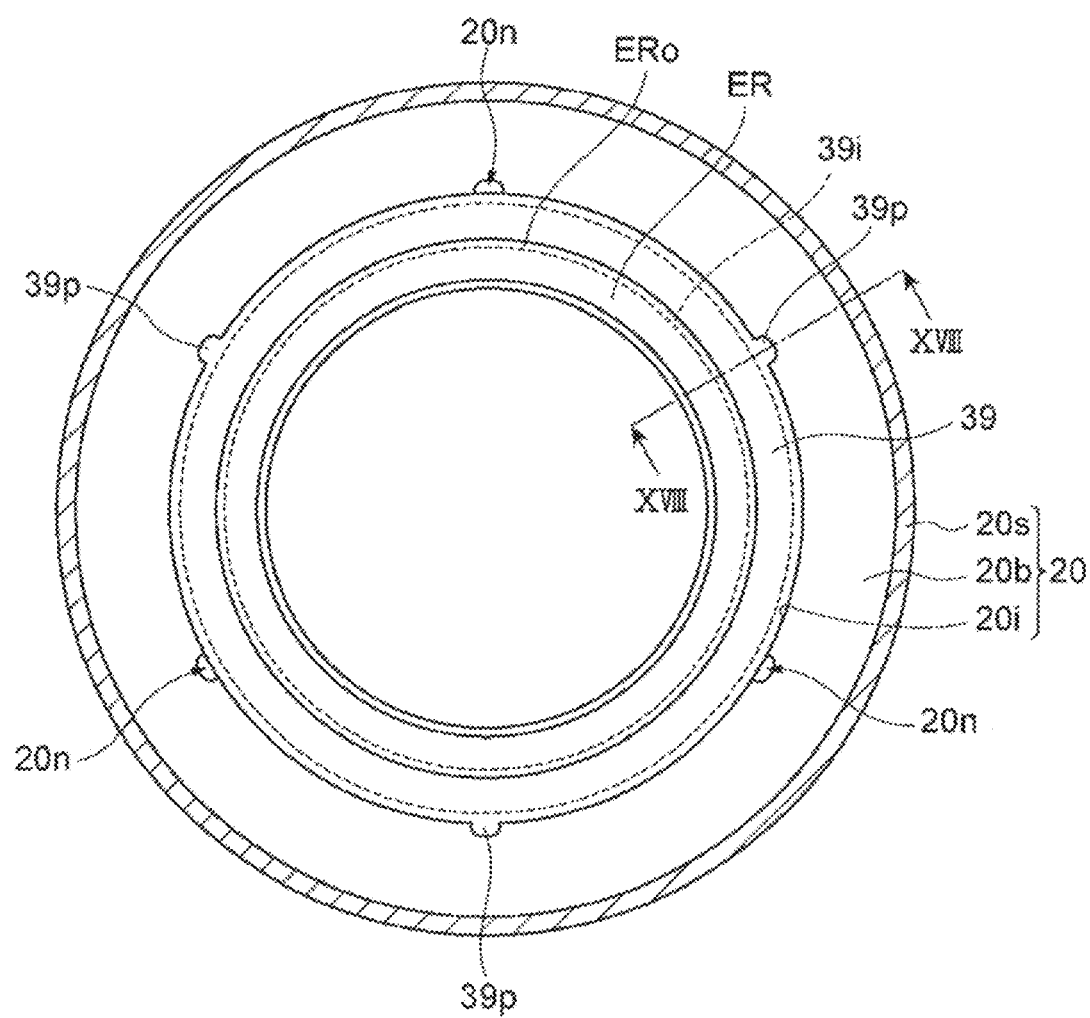
FIG. 17 is a plan view illustrating a part of a second chamber, a cover ring, and an edge ring in a substrate processing apparatus according to yet another exemplary embodiment.
Figure 18:
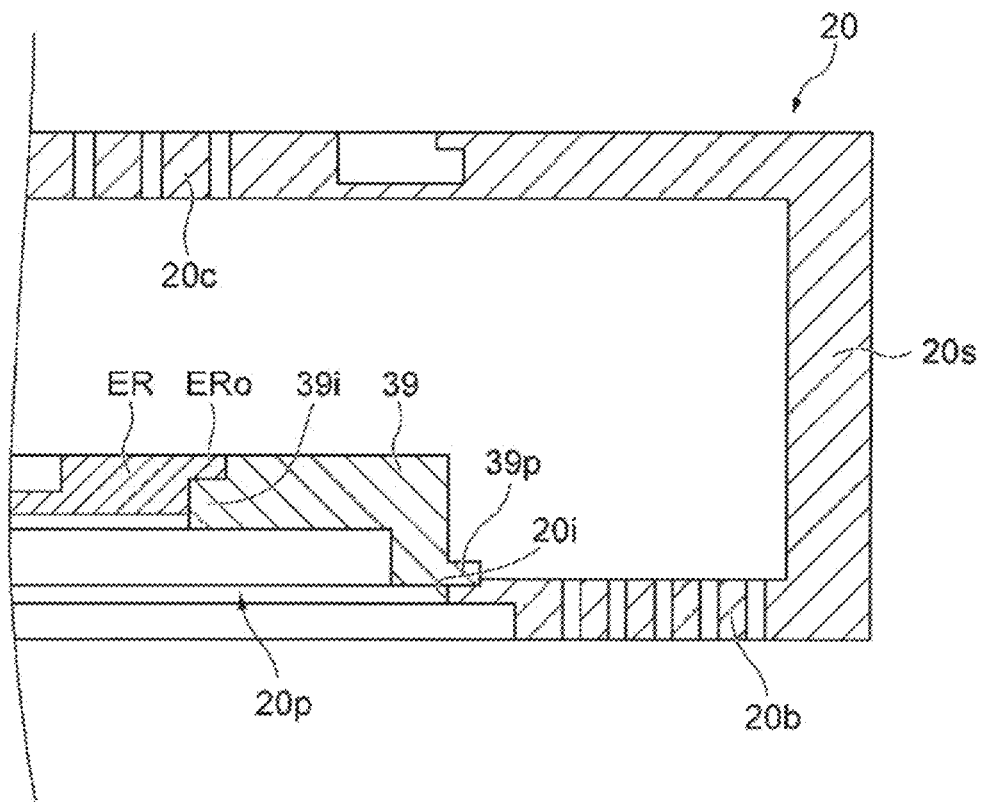
FIG. 18 is a cross-sectional view taken along line XVIII-XVIII in FIG. 17.
Figure 19:
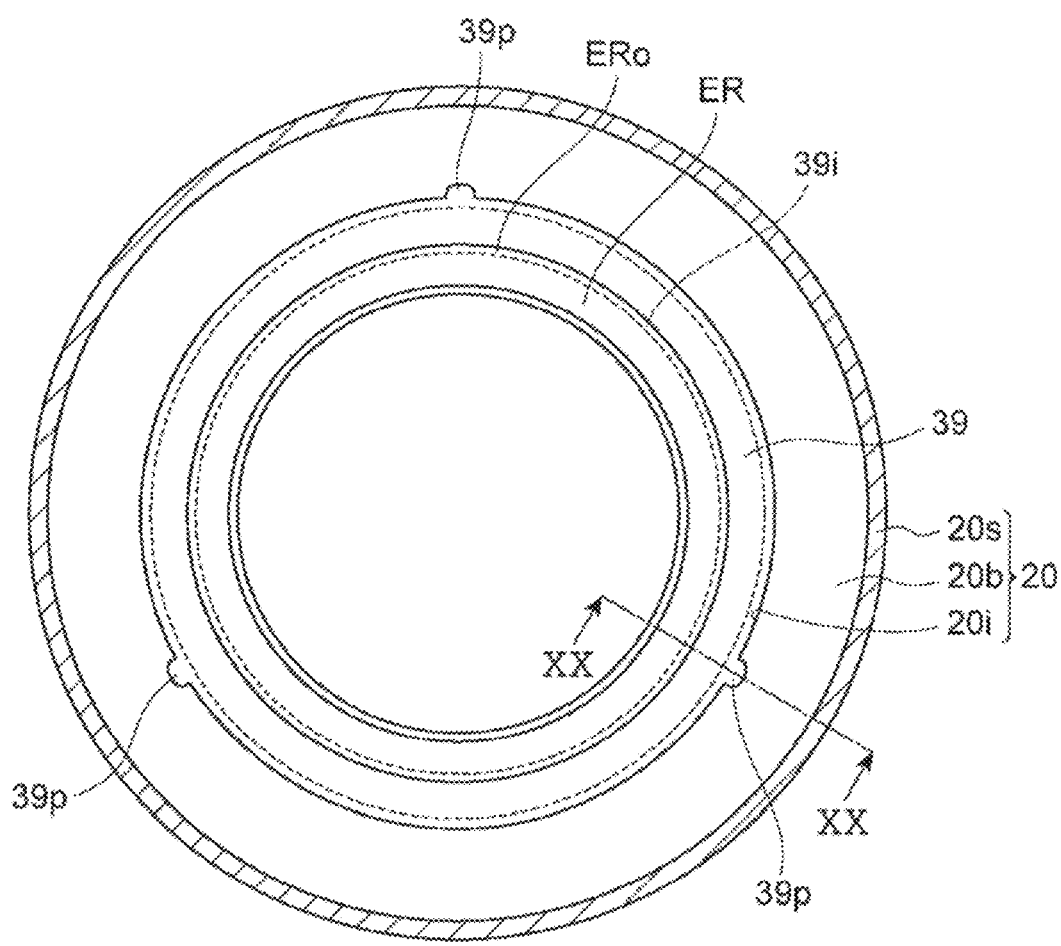
FIG. 19 is a plan view illustrating a part of a second chamber, a cover ring, and an edge ring in a substrate processing apparatus according to yet another exemplary embodiment.
Figure 20:
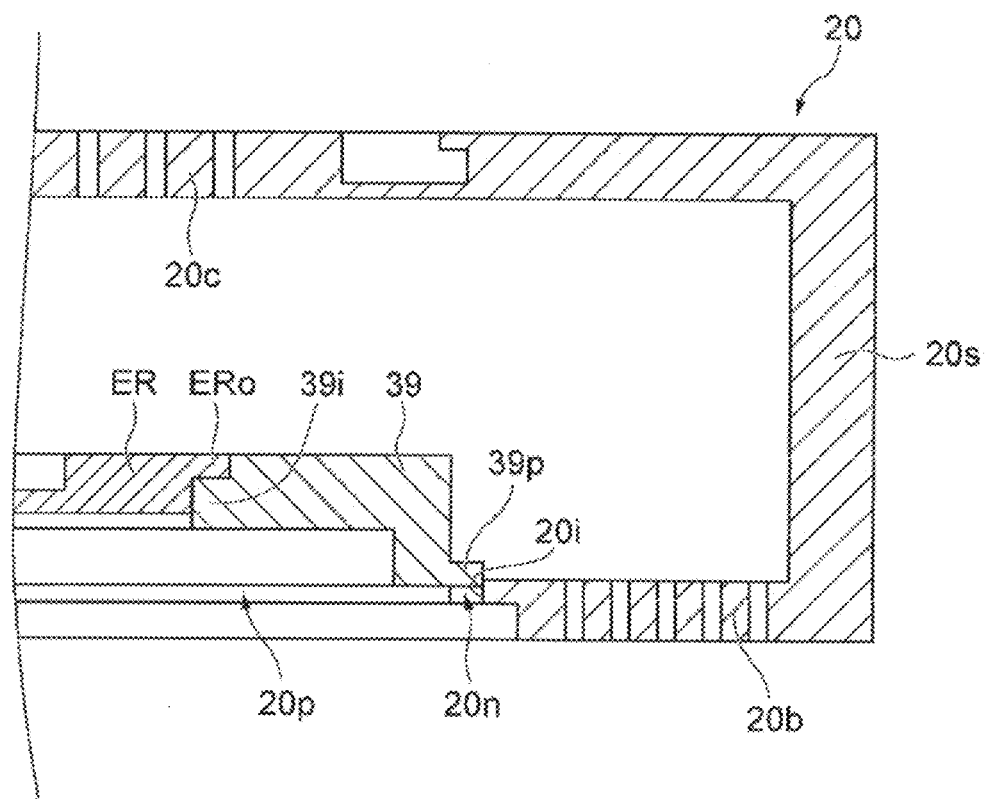
FIG. 20 is a cross-sectional view taken along line XX-XX in FIG. 19.

Hereinafter, reference is made to FIGS. 16 to 20. FIG. 16 is a partially enlarged cross-sectional view of a substrate processing apparatus according to yet another exemplary embodiment. FIG. 17 is a plan view illustrating a part of a second chamber, a cover ring, and an edge ring in a substrate processing apparatus according to yet another exemplary embodiment. FIG. 17 shows a state in which a plurality of convex portions of the cover ring are disposed on an inner edge portion of a bottom portion of the second chamber. FIG. 18 is a cross-sectional view taken along line XVIII-XVIII in FIG. 17. FIG. 19 is a plan view illustrating a part of a second chamber, a cover ring, and an edge ring in a substrate processing apparatus according to yet another exemplary embodiment. FIG. 19 shows a state in which positions of a plurality of convex portions of the cover ring coincide with positions of a plurality of notches provided by an inner edge portion of a bottom portion of the second chamber. FIG. 20 is a cross-sectional view taken along line XX-XX in FIG. 19.

In the substrate processing apparatus shown in FIGS. 16 to 20, a cover ring 39 includes an inner edge portion 39i and an outer edge portion. An outer edge portion ERo of an edge ring ER disposed on a substrate support 30 is disposed on the inner edge portion 39i and supported by the inner edge portion 39i. The outer edge portion of the cover ring 39 includes a plurality of convex portions 39p. The plurality of convex portions 39p protrude in the radial direction and are arranged in the circumferential direction.

The bottom portion 20b of the second chamber 20 includes an inner edge portion 20i. The inner edge portion 20i defines an inner hole 20p. The inner hole 20p is formed so that the edge ring ER supported by the cover ring 39, together with the cover ring 39, can pass to the outside of the second chamber 20 via the inner hole 20p from the inside of the second chamber 20. The inner hole 20p includes a plurality of notches 20n. The plurality of notches 20n are provided by the inner edge portion 20i. The plurality of notches 20n are arranged in the circumferential direction like the plurality of convex portions 39p. The plurality of notches 20n are formed so that the plurality of convex portions 39p may pass therethrough. The inner edge portion 20i of the bottom portion 20b of the second chamber 20 is configured to support the plurality of convex portions 39p of the cover ring 39 disposed thereon.

According to the substrate processing apparatus shown in FIGS. 16 to 20, the second chamber 20 may support the edge ring ER together with the cover ring 39 in a state in which positions of the plurality of convex portions 39p and positions of the plurality of notches 20n do not coincide with. Therefore, the cover ring 39 and the edge ring ER may be carried out together with the second chamber 20 from the inside of the first chamber 10 to the outside of the first chamber 10. In addition, when a position of the cover ring 39 in a rotational direction is adjusted to match the positions of the plurality of convex portions 39p and the positions of the plurality of notches 20n, it is possible to take out the cover ring 39 and the edge ring ER via the inner hole 20p from the second chamber 20. In addition, other configurations of the substrate processing apparatus shown in FIGS. 16 to 20 may be the as the corresponding configurations of the substrate processing apparatus 1.

Hereinbefore, although various exemplary embodiments have been described, various additions, omissions, substitutions, and changes may be made without being limited to the above-described exemplary embodiments. Also, it is possible to combine elements in different embodiments to form other embodiments.

For example, in a separate embodiment, the substrate processing apparatus may be another type of plasma processing apparatus such as an inductively coupled plasma processing apparatus, an electron cyclotron resonance (ECR) plasma processing apparatus, or a plasma processing apparatus that generates plasma using microwaves. Further, in another embodiment, the substrate processing apparatus may be a substrate processing apparatus configured to perform substrate processing other than plasma processing.

In addition, the transfer module CTM may not be movable and may be connected to and fixed to the first chamber of the substrate processing apparatus having the second chamber 20. In addition, instead of the transfer module CTM, the transfer module TM may be used as a module for carrying out the second chamber 20 from the inner space of the first chamber 10.

Further, the clamp 50 may include a cam mechanism fixing the second chamber 20 to the first chamber 10. The release mechanism 60 may be configured to rotate a cam of the cam mechanism to release the fixing of the second chamber 20 by the cam mechanism.

From the above description, it will be understood that various embodiments of the present disclosure have been described herein for description and that various changes may be made without departing from the scope and spirit of the present disclosure. Therefore, the various embodiments disclosed in the present specification are not intended to be limiting, and the true scope and generality are indicated by the appended claims.

The invention claimed is:

1. A substrate processing apparatus comprising:
a first chamber including a sidewall providing an opening, the first chamber further including a movable part movable upward and downward within the first chamber;
a substrate support disposed within the first chamber;
a second chamber disposed within the first chamber and defining, together with the substrate support, a processing space in which a substrate mounted on the substrate support is processed, the second chamber being separable from the first chamber and transportable between an inner space of the first chamber and the outside of the first chamber via the opening;
a clamp that releasably fixes the second chamber to the movable part extending above the second chamber; and
a lift mechanism that includes a driver and a shaft configured to move the movable part upward and downward.

2. The substrate processing apparatus of claim 1, wherein the second chamber includes a ceiling portion extending above the processing space, and the clamp releasably fixes the ceiling portion to the movable part.

3. The substrate processing apparatus of claim 2, wherein the clamp includes
a support having a lower end configured to suspend the ceiling portion therefrom.

4. The substrate processing apparatus of claim 1, further comprising a conductor provided along an outer periphery of the substrate support and connected to the ground, and a contact electrically connected to the conductor,
wherein the second chamber is in contact with the contact while defining the processing space together with the substrate support.

5. The substrate processing apparatus of claim 4, wherein the contact is configured to be in elastic contact with the second chamber.

6. The substrate processing apparatus of claim 5, wherein the contact includes a spring.

7. The substrate processing apparatus of claim 4, wherein the contact is a pin, and the second chamber provides a recess into which the pin is fitted.

8. The substrate processing apparatus of claim 7, wherein the pin has a tapered shape, and the recess of the second chamber has a tapered shape corresponding to the tapered shape of the pin.

9. The substrate processing apparatus of claim 5, wherein the contact is flexible and includes a film formed of a conductive material, and
the substrate processing apparatus further comprises a separate air supply device configured to apply air pressure to the film to pressurize the film into the second chamber.

10. The substrate processing apparatus of claim 4, wherein the second chamber includes a bottom portion extending below the processing space, and the bottom portion is in contact with the contact.

11. The substrate processing apparatus of claim 1, further comprising a cover ring having an inner edge portion and an outer edge portion,
wherein an edge ring is disposed on the substrate support,
the inner edge portion of the cover ring supports an outer edge portion of the edge ring disposed thereon,
the outer edge portion of the cover ring includes a plurality of convex portions protruding in a radial direction, and
the second chamber includes a bottom portion having an inner edge portion defining an inner hole through which the edge ring and the cover ring pass, and supports the cover ring in a state in which the plurality of convex portions are disposed on the inner edge portion of the bottom portion, and
the inner hole includes a plurality of notches through which the plurality of convex portions are passable and which are provided by the inner edge portion.

12. The substrate processing apparatus of claim 1, which is a plasma processing apparatus.

13. A substrate processing system comprising:
the substrate processing apparatus according to claim 1;
a transfer module having a transfer device and a separate chamber including a sidewall providing an opening, wherein the transfer device is configured to transfer the second chamber from the inner space of the first chamber to an inner space of the separate chamber via the opening of the first chamber and the opening of the separate chamber; and
a control unit comprising a computer configured to control the lift mechanism, a release mechanism, and the transfer device,
wherein the control unit controls:
the lift mechanism to separate the movable part and the second chamber upward from the substrate support, and
the transfer device to transfer the second chamber, the fixing of which by the clamp is released, from the inner space of the first chamber to the inner space of the separate chamber via the opening of the first chamber and the opening of the separate chamber.

14. The substrate processing system of claim 13, wherein the substrate processing apparatus further includes a gate valve configured to open and close the opening of the first chamber,
the transfer module further includes a gate valve configured to open and close the opening of the separate chamber and is configured to be movable,
the sidewall of the first chamber, the sidewall of the separate chamber, the gate valve of the substrate processing apparatus, and the gate valve of the transfer module define a sealed space thereamong in a state in which the separate chamber is connected to the first chamber, and
the substrate processing system further comprises an exhaust device configured to depressurize the sealed space.

15. The substrate processing apparatus of claim 2, further comprising a conductor provided along an outer periphery of the substrate support and connected to the ground, and a contact electrically connected to the conductor,
wherein the second chamber is in contact with the contact while defining the processing space together with the substrate support.

16. The substrate processing apparatus of claim 3, further comprising a conductor provided along an outer periphery of the substrate support and connected to the ground, and a contact electrically connected to the conductor,
wherein the second chamber is in contact with the contact while defining the processing space together with the substrate support.

17. The substrate processing apparatus of claim 5, wherein the second chamber includes a bottom portion extending below the processing space, and the bottom portion is in contact with the contact.

18. The substrate processing apparatus of claim 7, wherein the second chamber includes a bottom portion extending below the processing space, and the bottom portion is in contact with the contact.

19. The substrate processing apparatus of claim 8, wherein the second chamber includes a bottom portion extending below the processing space, and the bottom portion is in contact with the contact.

20. The substrate processing apparatus of claim 9, wherein the second chamber includes a bottom portion extending below the processing space, and the bottom portion is in contact with the contact.

* * * * *